(12) United States Patent
Perreault et al.

(10) Patent No.: US 8,830,710 B2
(45) Date of Patent: Sep. 9, 2014

(54) RF ENERGY RECOVERY SYSTEM

(71) Applicant: Eta Devices, Inc., Cambridge, MA (US)

(72) Inventors: David J. Perreault, Brookline, MA (US); Joel L. Dawson, Roslindale, MA (US)

(73) Assignee: Eta Devices, Inc., Cambridge, MA (US)

( * ) Notice: Subject to any disclaimer, the term of this patent is extended or adjusted under 35 U.S.C. 154(b) by 0 days.

(21) Appl. No.: 13/755,335

(22) Filed: Jan. 31, 2013

(65) Prior Publication Data

US 2013/0343106 A1    Dec. 26, 2013

Related U.S. Application Data

(60) Provisional application No. 61/663,930, filed on Jun. 25, 2012.

(51) Int. Cl.

| | | |
|---|---|---|
| H02M 7/10 | (2006.01) | |
| H03F 3/00 | (2006.01) | |
| H02M 7/06 | (2006.01) | |
| H02M 7/217 | (2006.01) | |
| H03H 7/38 | (2006.01) | |

(52) U.S. Cl.
CPC . *H03H 7/38* (2013.01); *H03F 3/00* (2013.01); *H02M 7/06* (2013.01); *H02M 7/217* (2013.01)
USPC .............................. 363/67; 363/69

(58) Field of Classification Search
CPC ................................. H02M 7/217; H03H 7/38
USPC ................................. 363/65, 67, 69
See application file for complete search history.

(56) References Cited

U.S. PATENT DOCUMENTS

| | | | |
|---|---|---|---|
| 4,319,359 A | * | 3/1982 | Wolf ............................. 375/238 |
| 5,568,088 A | | 10/1996 | Dent et al. |
| 5,638,024 A | | 6/1997 | Dent et al. |
| 5,708,573 A | | 1/1998 | Lusher et al. |

(Continued)

FOREIGN PATENT DOCUMENTS

| | | |
|---|---|---|
| GB | 1506633 | 4/1978 |
| WO | WO 0067373 | 11/2000 |

(Continued)

OTHER PUBLICATIONS

Beltran, et al.; "An Outphasing Transmitter Using Class-E PAs and Asymmetric Combining: Part 1;" High Frequency Electronics: Summit Technical Media, LLC; Apr. 2011; pp. 18-26.

(Continued)

*Primary Examiner* — Matthew Nguyen
(74) *Attorney, Agent, or Firm* — Daly, Crowley, Mofford & Durkee, LLP

(57) ABSTRACT

An energy recovery system is provided that can be used in place of a resistive termination. The energy recovery system can simulate the behavior and performance of a resistive termination, while recovering at least some of the energy that would otherwise have been dissipated within the termination. In one embodiment, the energy recovery system includes a rectification system having a plurality of tuned rectifier circuits and an RF input network to provide input power distribution to the plurality of tuned rectifier circuits and input impedance shaping to shape the collective input impedance of the plurality of tuned rectifier circuits as seen at the RF input port of the RF input network.

22 Claims, 16 Drawing Sheets

(56) References Cited

U.S. PATENT DOCUMENTS

| | | | |
|---|---|---|---|
| 5,736,877 A | 4/1998 | Tihanyi | |
| 5,892,395 A | 4/1999 | Stengel et al. | |
| 6,600,384 B2 | 7/2003 | Mohwinkel et al. | |
| 6,887,339 B1 | 5/2005 | Goodman et al. | |
| 7,279,971 B2 | 10/2007 | Hellberg et al. | |
| 7,508,262 B1 * | 3/2009 | Wagner et al. | 330/136 |
| 7,535,133 B2 | 5/2009 | Perreault et al. | |
| 7,589,605 B2 | 9/2009 | Perreault et al. | |
| 7,889,519 B2 | 2/2011 | Perreault et al. | |
| 7,956,572 B2 | 6/2011 | Zane et al. | |
| 8,026,763 B2 | 9/2011 | Dawson et al. | |
| 8,164,384 B2 | 4/2012 | Dawson et al. | |
| 8,212,541 B2 | 7/2012 | Perreault et al. | |
| 8,451,053 B2 | 5/2013 | Perreault et al. | |
| 8,638,156 B2 | 1/2014 | Shibata et al. | |
| 2004/0027209 A1 | 2/2004 | Chen et al. | |
| 2006/0193095 A1 | 8/2006 | Hunter et al. | |
| 2009/0200985 A1 | 8/2009 | Zane et al. | |
| 2010/0120384 A1 | 5/2010 | Pennec | |
| 2011/0187437 A1 | 8/2011 | Perreault et al. | |
| 2011/0215866 A1 | 9/2011 | Dawson et al. | |
| 2012/0176195 A1 | 7/2012 | Dawson et al. | |
| 2012/0313602 A1 | 12/2012 | Perreault et al. | |
| 2012/0326684 A1 | 12/2012 | Perreault et al. | |
| 2013/0241625 A1 | 9/2013 | Perreault et al. | |
| 2013/0343107 A1 | 12/2013 | Perreault | |
| 2014/0118063 A1 | 5/2014 | Briffa et al. | |
| 2014/0118065 A1 | 5/2014 | Briffa et al. | |
| 2014/0118072 A1 | 5/2014 | Briffa et al. | |
| 2014/0120854 A1 | 5/2014 | Briffa et al. | |
| 2014/0125412 A1 | 5/2014 | Dawson et al. | |
| 2014/0132354 A1 | 5/2014 | Briffa et al. | |

FOREIGN PATENT DOCUMENTS

| | | |
|---|---|---|
| WO | WO 01/10013 A1 | 2/2001 |
| WO | WO 2005/106613 A1 | 11/2005 |
| WO | WO 2006/119362 A2 | 11/2006 |
| WO | WO 2007/082090 A2 | 7/2007 |
| WO | WO 2007/094921 A1 | 8/2007 |
| WO | WO 2010/056646 A1 | 5/2010 |
| WO | WO 2011/097387 A1 | 8/2011 |
| WO | WO 2013/109719 A1 | 7/2013 |
| WO | WO 2013/109743 A2 | 7/2013 |
| WO | WO 2013/109797 A1 | 7/2013 |
| WO | WO 2013/134573 A1 | 9/2013 |
| WO | WO 2013/191757 A1 | 12/2013 |
| WO | WO 2013/048747 A2 | 1/2014 |
| WO | WO 20141/028441 A2 | 2/2014 |
| WO | WO 2014/070474 A1 | 5/2014 |
| WO | WO 2014/070475 A1 | 5/2014 |
| WO | WO 2014/070998 A1 | 5/2014 |
| WO | WO 2014/085097 A1 | 6/2014 |

OTHER PUBLICATIONS

Beltran, et al.; "An Outphasing Transmitter Using Class-E PAs and Asymmetric Combining: Part 2;" High Frequency Electronics; Summit Technical Media, LLC; May 2011; pp. 34-46.

Chang, et al.; "A Power-Recycling Technique for Improving Power Amplifier Efficiency Under Load Mismatch;" IEEE Microwave and Wireless Components Letters; vol. 21; No. 10; Oct. 2011; pp. 571-573.

Eun, et al.; "A High Linearity Chireix Outphasing Power Amplifier Using Composite Right/Left-Handed Transmission Lines;" Proceedings of the 4$^{th}$ European Radar Conference; Oct. 2007; pp. 343-346.

Gerhard, et al.; "Novel Transmission Line Combiner for High Efficient Outphasing RF Power Amplifiers;" Proceedings of the 37$^{th}$ European Microwave Conference; Oct. 2007; pp. 1433-1436.

Gody, et al.; "Outphasing Energy Recovery Amplifier with Resistance Compression for Improved Efficiency;" IEEE Transactions on Microwave Theory and Techniques; vol. 57; No. 12; Dec. 2009; pp. 2895-2906.

Gutmann, et al.; "Power Combining in an Array of Microwave Power Rectifiers;" IEEE Microwave Symposium Digest; Apr. 30, 1979-May 2, 1979; pp. 453-455.

Han, et al.; "Resistance Compression Networks for Radio-Frequency Power Conversion;" IEEE Transactions on Power Electronics; vol. 22; No. 1; Jan. 2007; pp. 41-53.

Langridge, et al.; "A Power Re-Use Technique for Improved Efficiency of Outphasing Microwave Power Amplifiers;" IEEE Transactions on Microwave Theory and Techniques; vol. 47; No. 8; Aug. 1999; pp. 1467-1470.

Nitz, et al.; "A New Family of Resonant Rectifier Circits for High Frequency DC-DC Converter Applications;" Applied Power Electronics Conference and Exposition; 1988; APEC 88; Conference Proceedings 1988; Feb. 1-5, 1988; pp. 12-22.

Paing, et al., "Resistor Emulation Approach to Low-Power RF Energy Harvesting;" IEEE Transactions on Power Electronics; vol. 23; No. 3; May 2008; pp. 1494-1501.

Perreault; "A New Power Combining and Outphasing Modulation System for High-Efficiency Power Amplification," IEEE Transactions on Circuits and Systems-I: Regular Papers; vol. 58; No. 8; Aug. 2011; pp. 1713-1726.

Rivas, et al.; "New Architecture for Radio Frequency dc/dc/ Power Conversion;" 2004 35$^{th}$ Annual EIII Power Electronics Specialist Conference; Aachen, German; vol. 15; Jun. 2004; pp. 4074-4084.

International Search Report and Written Opinion of the ISA for PCT/US2006/016981 dated Dec. 2006.

U.S. Pat. No. 7,535,133 issued on May 19, 2009.

PCT Search Report of the ISA for PCT/US2013/048747 dated Jan. 31, 2014.

PCT Written Opinion of the ISA for PCT/US2013/046747 dated Jan. 31, 2014.

Office Action dated Mar. 28, 2014 from U.S. Appl. No. 13/800,221, filed Mar. 13, 2013.

Response to Office Action Mar. 28, 2014 Office Action as filed on Apr. 10, 2014 from U.S. Appl. No. 13/800,221, filed Mar. 13, 2013.

Notice of Allowance for U.S. Appl. No. 13/800,221, filed Mar. 13, 2013.

* cited by examiner

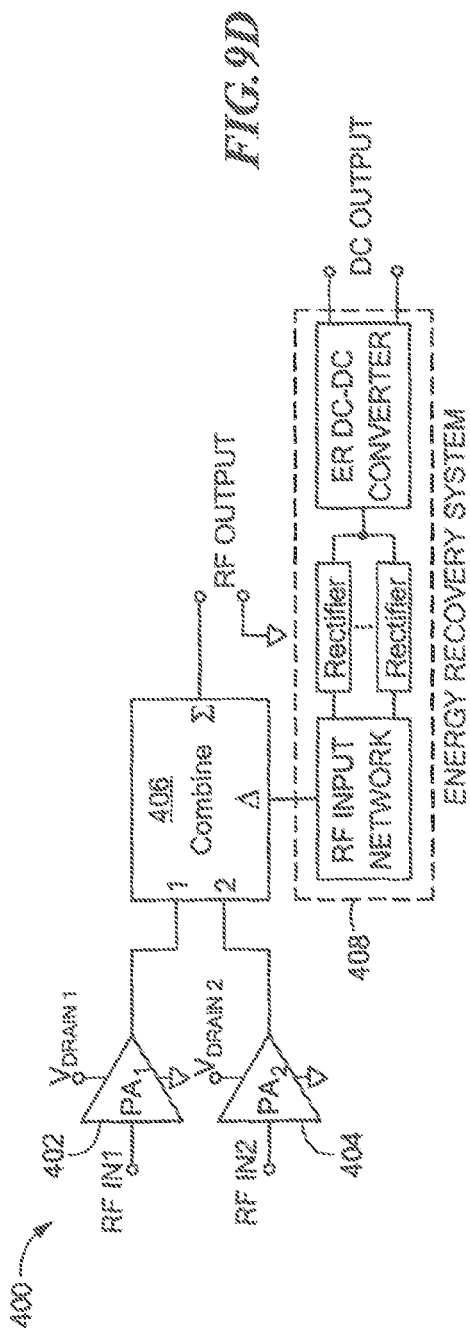

US 8,830,710 B2

RF ENERGY RECOVERY SYSTEM

CROSS REFERENCE TO RELATED APPLICATIONS

This application claims the benefit of U.S. Provisional Application No. 61/663,930 filed Jun. 25, 2012 under 35 U.S.C. §119(e) which application is hereby incorporated herein by reference in its entirety.

FIELD

Subject matter disclosed herein relates generally to radio frequency (RF) systems and, more particularly, to techniques for enhancing the power efficiency of RF systems.

BACKGROUND

Many radio-frequency circuits incorporate power resistors that dissipate energy during circuit operation. Such circuits include radio-frequency (RF) hybrids, power combiners and dividers, isolators, duplexers, outphasing RF power amplifiers, composite RF amplifier systems, termination networks and filters, among other devices. In such applications, resistors are often specified as isolation resistors, terminating resistors, dump resistors, etc. While the power dissipation associated with these resistors is undesirable, their terminal characteristics (and absorption of RF electrical power) are typically necessary for proper circuit function. For example, a terminating resistor of a specified resistance value is necessary in an isolating power combiner (such as, for example, a Wilkinson combiner) in order to preserve isolation between the combiner input ports. Likewise, a circulator having a terminating resistor coupled to a port thereof may be used as an RF isolator that passes signals flowing in one direction while terminating signals flowing in an opposite direction. The energy absorption of the resistor coupled to the circulator is required for the isolator to function as intended.

Because efficiency and energy draw are important in many RF applications, the loss associated with such resistors is undesirable. Moreover, the heat generated by such resistors is undesirable and can limit miniaturization of these items and place burdens on supporting devices (e.g., increasing cooling requirements, requiring fans, etc.). It would thus be desirable to realize the electrical function of these power resistors (e.g., providing a nearly constant equivalent resistive input impedance at a specified operating frequency and absorbing RF electrical power), while reducing the dissipation of the absorbed power.

SUMMARY

Systems and techniques are described herein for providing desired operational characteristics of a resistive termination in an RF system, while also allowing power that would normally be dissipated in a resistive termination to be recovered and converted to a useable form.

In accordance with one aspect of the concepts, systems, circuits, and techniques described herein, an energy recovery system is provided that is capable of simulating the behavior of a resistive termination by providing an approximately constant, resistive input impedance to a radio frequency (RF) circuit coupled to the energy recovery system, while recovering energy that would otherwise have been dissipated had a resistive termination been used. The energy recovery system may comprise: a rectification system having a plurality of tuned rectifier circuits and a plurality of rectifier input ports corresponding to the plurality of tuned rectifier circuits, the rectification system to rectify RF energy received at the plurality of rectifier input ports to generate a direct current (dc) signal at one or more rectifier output ports, wherein the tuned rectifier circuits are each tuned to provide an approximately resistive input impedance across a finite input power range; an RF input network having an RF input port and multiple RF output ports, the RF input port forming an input of the energy recovery system and the multiple RF output ports being coupled to the plurality of rectifier input ports of the rectification system, the RF input network to provide input power distribution to the plurality of tuned rectifier circuits and input impedance shaping to shape the combined input impedance of the plurality of tuned rectifier circuits as seen at the RF input port of the RF input network; and a dc-dc converter system having an energy recovery input port and a dc output port, the energy recovery input port of the dc-dc converter system coupled to the output port of at least one rectifier to convert rectified power to a useable dc output voltage, wherein the voltage at the energy recovery input port of the do-dc converter system is regulated.

In accordance with a further aspect of the concepts, systems, circuits, and techniques described herein, a machine implemented method for use in capturing energy output by a radio frequency (RF) circuit comprises: receiving an RF signal from the RF circuit; distributing the RF signal among a plurality of tuned rectifier circuits, the plurality of tuned rectifier circuits to each generate a direct current (dc) signal at an output thereof in response to the RF input signal, wherein the plurality of tuned rectifier circuits are each tuned to provide an approximately resistive input impedance across a finite input power range; providing impedance shaping for the approximately resistive input impedances of the plurality of tuned rectifier circuits to provide an approximately constant, resistive input impedance to the RF circuit; and regulating an output voltage of the plurality of tuned rectifier circuits.

BRIEF DESCRIPTION OF THE DRAWINGS

The foregoing features may be more fully understood from the following description of the drawings in which:

FIGS. 9D and 9E are block diagrams illustrating example power amplification systems using energy recovery in accordance with various embodiments;

DETAILED DESCRIPTION

Systems and techniques are described herein for providing desired operational characteristics of a resistive termination in a radio frequency (RF) system, while also allowing power that would normally be dissipated in a resistive termination to be recovered and converted to a useable form. Likewise, a termination to a radio-frequency power receiver (such as an antenna or coil) that maintains desirable operating characteristics (e.g., providing a constant matched resistive termination) as operating conditions change can capture RF power that would normally be reflected or lost. To recover RF power and convert it to direct current (dc) signals, the power must be rectified. However, rectification presents many challenges in practice, especially at microwave frequencies (e.g., frequencies above 300 MHz).

First, while one may desire a constant resistive input impedance (e.g., 50 Ohms) to realize a desired circuit function, rectifiers at microwave frequencies typically present effective input impedances that are difficult to make resistive and which vary with RF power level and dc output voltage. In systems having a high peak-to-average power ratio, the problem is particularly challenging. Second, harmonics in the RF input or associated with the rectifier system itself can affect rectifier behavior, and harmonic voltages or currents generated at the energy recovery system input by rectifier operation can be problematic to overall system operation. Third, devices capable of rectifier operation at microwave frequencies are often small (and hence cannot individually handle needed power levels), and rectifier circuits employing them are constrained to operate at low alternating current (ac) input voltages and at dc output voltages that may not be useful for utilizing recovered energy. Moreover, at microwave frequencies, the parasitics associated with rectifier devices (such as, for example, device capacitance and package inductance) can have substantial influence on circuit operation, and make it difficult to provide the desired RF input characteristics. Lastly, the RF input port where the resistor is being replaced is often floating with respect to system ground, while the recovered energy must often be provided at an output port that is referenced to system ground. In various aspects described herein, techniques and circuits are provided that make energy recovery at microwave frequencies practical and effective.

Figure 1:
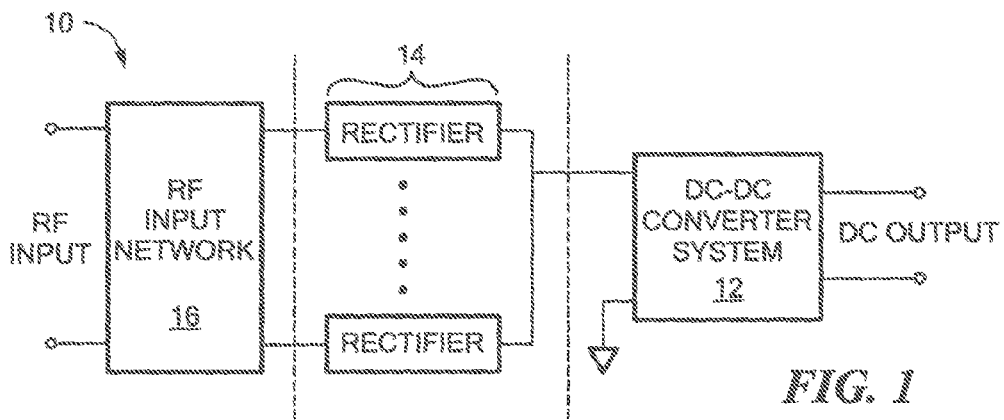
FIG. 1 is a block diagram illustrating an exemplary energy recovery system in accordance with an embodiment.

FIG. 1 is a block diagram illustrating an exemplary energy recovery system 10 in accordance with an embodiment. As illustrated, the energy recovery system 10 includes: an energy recovery dc-dc converter system 12, a plurality of tuned rectifier circuits 14, and an RF input network 16 providing functions such as input impedance shaping, filtering, RF power distribution to the plurality of rectifier circuits, and/or level shifting. As will be described in greater detail, in some alternative embodiments, multiple sets of rectifiers and RF input networks may be coupled to the same energy recovery dc-dc converter. In some other embodiments, an individual energy recovery dc-dc converter system may be provided for each rectifier. Other architectures are also possible.

As mentioned above, one challenge to realizing a practical RF energy recovery system is the fact that effective rectifier input impedance (i.e., the complex ratio of the fundamental component of RF voltage to fundamental RF current at the rectifier input port) depends upon the RF input power level and the rectifier output voltage. Moreover, the output voltage that a practical rectifier device or circuit can operate into is often not at a useful level for utilizing recovered energy. The energy recovery dc-dc converter system 12 is provided to address this challenge.

Figure 2A:
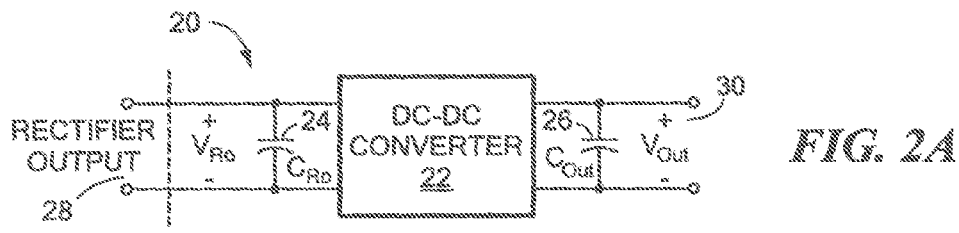
FIGS. 2A-2F are schematic diagrams illustrating energy recovery dc-dc converter systems in accordance with various embodiments.

FIG. 2A is a schematic diagram illustrating an exemplary energy recovery dc dc converter system 20 in accordance with an embodiment. As illustrated, the energy recovery dc-dc converter system 20 includes a single dc-dc converter 22. In some implementations (e.g. designs operated to include burst-mode operation), input and output capacitances $C_{RO}$ 24 and $C_{OUT}$ 26 may be provided at the input and output of converter 22 to limit voltage ripple under bursting at frequencies below the converter switching frequency. The energy recovery dc-dc converter system 20 of FIG. 2A may be used in an energy recovery system that uses, for example, a single dc-dc converter (e.g., the energy recovery system of FIG. 1). As illustrated, converter system 20 includes an input port 28 to be coupled to the outputs of the plurality of rectifiers and an output port 30 to be coupled to a load network to which recovered energy is to be delivered. In order to provide desired impedance characteristics at the RF energy recovery system input, the energy recovery dc-dc converter system 20 may be controlled to regulate the voltage at input port 28 while absorbing the power delivered from the rectifiers and delivering the absorbed power to output port 30. This can be achieved using, for example, a dc-dc converter such as a buck converter, a boost converter, a flyback converter, a buck-boost converter, or other topology, with control designed to regulate the input voltage of the dc-dc converter. Output power from the converter can be provided to a regulated or unregulated output.

The energy recovery system may often be required to operate at high peak-to-average RF power ratios. Consequently, the instantaneous power delivered to the energy recovery dc-dc converter input port 28 may vary over a wide range. Therefore, in some embodiments, converter 22 may be optimized for operation over a wide range of power levels, including the use of burst mode, cycle skipping, gate-width switching, phase shedding, and related techniques to maintain high efficiency over a wide power range.

In one implementation, the dc-dc converter 22 of FIG. 2A may be rated for the peak RF power to be recovered, thereby enabling continuous operation at peak RF power conditions. In some applications, however, it is known that such peak power conditions only occur for a limited duration. In these applications, the energy recovery converter input capacitor 24 (or other energy storage element) may be made sufficiently large such that the converter only needs to process a fraction of the peak power rating of the recovery system (but at least the average power rating), while still enabling the voltage at the rectifier output (and the energy recovery converter input 28) to be regulated to within a desired voltage range.

In many applications, it may be desirable to regulate the energy recovery converter input 28 to a nearly fixed voltage independent of rectifier input power, to provide desired operating characteristics (and effective input impedance values) of the rectifiers and, in turn, desired input impedance characteristics of the energy recovery system. In one exemplary embodiment, this is achieved by comparing the energy recovery power converter input voltage to a reference voltage to generate an error signal, and controlling the converter input current, switch current, burst rate, switching frequency, duty ratio or other control variable as a function of the error signal. That is, in this approach, the converter input voltage is regulated to a value at or near the reference voltage by feedback control of the converter. FIG. 2D is a block diagram illustrating example circuitry for performing this voltage regulation in accordance with an exemplary embodiment.

Alternatively, the energy recovery converter input voltage $V_{RO}$ may be regulated to a voltage that is a function of the current or power delivered to or from the rectifiers. This can be used to extend the operating power range over which the energy recovery system has desirable effective input impedance characteristics (e.g., 50 Ohms, etc.). To understand this, it should be recognized that the effective input resistance of a rectifier is a function of both the power level at which the rectifier is operating and of the rectifier output voltage. For example, as is known in the art, some rectifiers ideally provide an input resistance at the fundamental operating frequency of the form $R_{eff}=k(V_{RO})^2/P$, where $R_{eff}$ is the effective resistance at the rectifier input, $V_{RO}$ is the rectifier dc output voltage, P is the rectifier output power, and k is a constant that depends on the rectifier topology. For an ideal full-bridge diode rectifier topology, for example, $k=8/\pi^2$. For an ideal voltage-doubler rectifier topology, $k=2/\pi^2$ and so on. By adjusting the energy recovery converter input voltage (rectifier output voltage) to be smaller for low power (or rectifier (or rectifier current) levels, the effective resistance provided by the rectifier can be more approximately constant (vary over a smaller range) than if a constant voltage $V_{RO}$ is used. This can be achieved by adjusting the above-mentioned reference voltage as a function of measured, estimated, or expected power, current or another related variable. It should be noted that to achieve this dynamic reference alternative, it is desirable to size the energy recovery converter input capacitance $C_{RO}$ (in conjunction with any rectifier output capacitance) large enough such that the rectifier output voltage ripple at the RF frequency and harmonics is small, but small enough that the rectifier output voltage can adjust on a time scale associated with the power variations to be compensated. FIG. 2E is a block diagram illustrating example circuitry for performing voltage regulation with a dynamic reference in accordance with an exemplary embodiment.

Figure 2B:
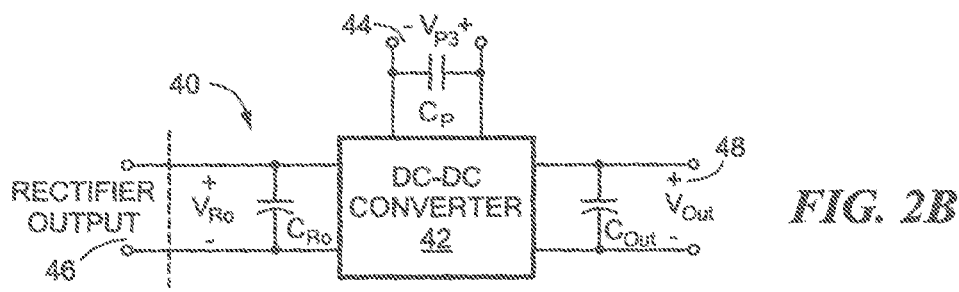

FIG. 2B is a schematic diagram illustrating an energy recovery dc-dc converter system 40 in accordance with another embodiment. In this embodiment, the energy recovery converter 42 is provided with a third port 44 from which energy may be drawn and/or delivered. With a third port, the energy recovery converter 42 can be configured to regulate the voltage at both its input port ($V_{RO}$) 46 and its output port ($V_{OUT}$) 48. For example, in one approach, the converter 42 can be configured as a two-input dc-dc converter with a single output. In another approach, the converter 42 can be configured to transfer power in any direction among the ports 44, 46, 48. Power needed to regulate the output port voltage that is not sourced from the input port (and rectifiers) can instead be sourced from the third port 44. Typically, the third port 44 will provide an average source of power, but in some cases it may be constructed as a large energy buffer only, such that long-term average power is always sourced from the input port and only temporarily stored at the third port 44. As described above, $V_{RO}$ may be regulated to a fixed voltage or to a variable voltage.

Figure 2C:
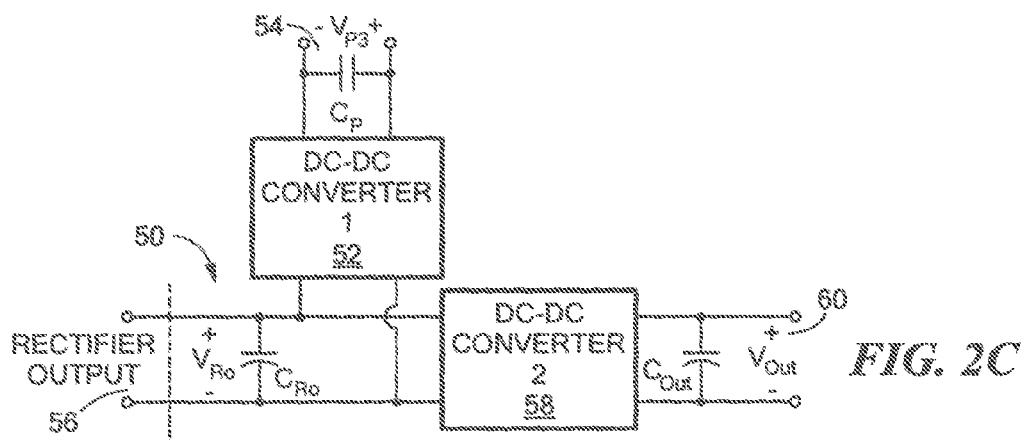
Figure 2D:
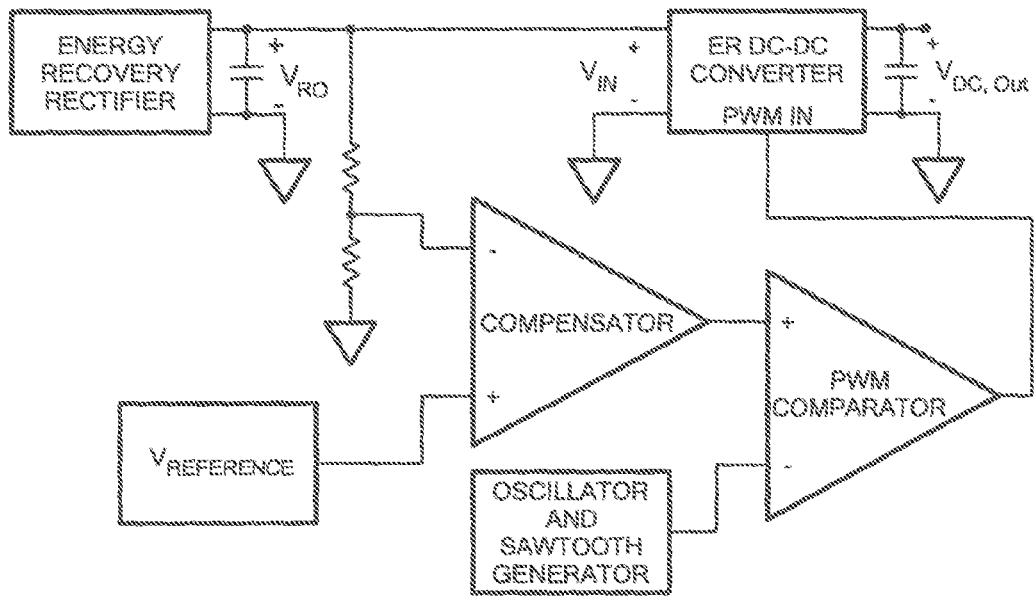
Figure 2E:
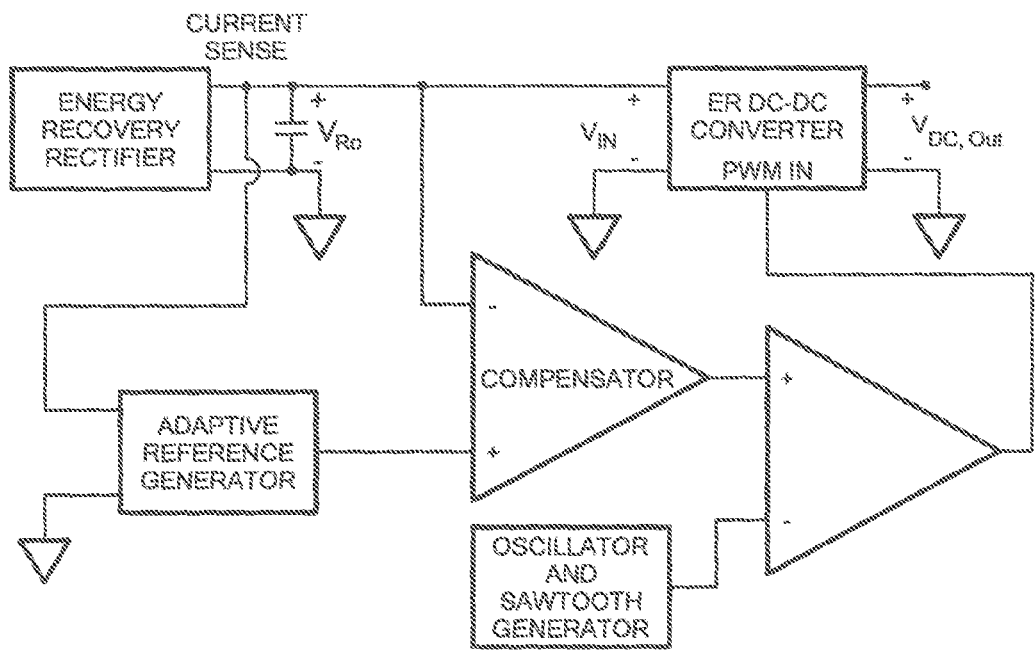

FIG. 2C is a schematic diagram illustrating another exemplary energy recovery dc-dc converter system 50 in accordance with an embodiment. In this embodiment, a first converter 52 supplied from a third port 54 ($V_{P3}$) regulates the voltage ($V_{RO}$) at the energy recovery converter system input port 56 (i.e., the rectifier output), while a second converter 58 is supplied from this voltage and regulates voltage ($V_{OUT}$) at an output port 60. While the first and second converters 52, 58 may both be provided as switched-mode converters, in some applications the second converter 58 (regulating $V_{OUT}$) may be realized as a linear regulator to reduce noise at the output port 60. In some embodiments, additional converters powered from $V_{RO}$ may be utilized to regulate additional outputs. The additional converters can each be powered directly from $V_{RO}$ or they can be cascaded so that the output of one converter powers the input of another, and so on.

Figure 2F:
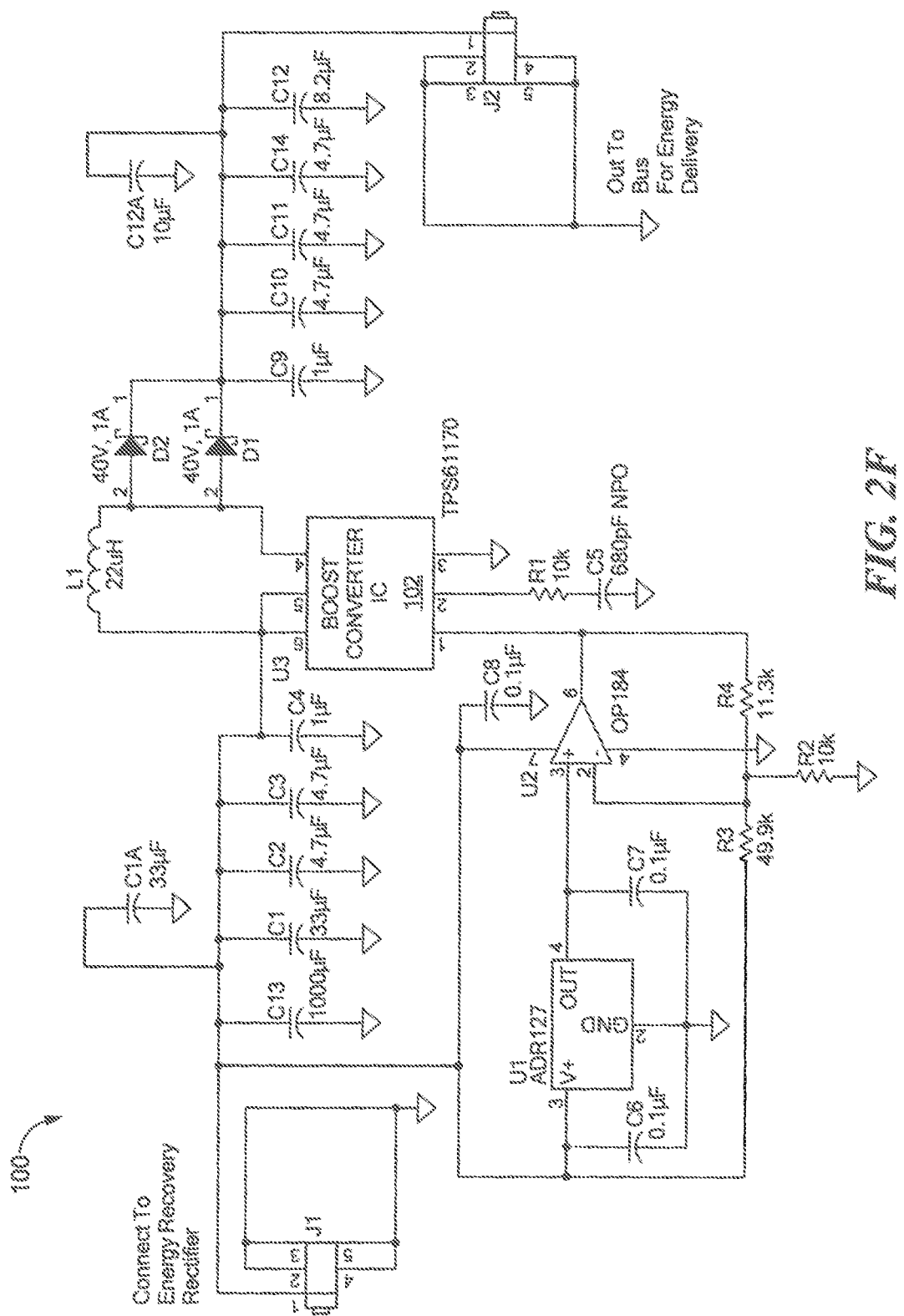

FIG. 2F is a schematic diagram illustrating an energy recovery dc-dc converter circuit 100 that may be used within an energy recovery system in accordance with an embodiment. The dc-dc converter circuit 100 uses an off the shelf, integrated, high voltage boost converter IC 102 (e.g., Texas Instruments TPS61170) that is coupled to control circuitry for supporting operation in an energy recovery system. The high voltage boost converter IC 102 has a feedback port that was designed for use in controlling the output voltage of the converter. As shown in FIG. 2F, the energy recovery dc-dc converter circuit 100 includes logic coupled to the feedback port of the boost converter IC 102 that causes the chip to regulate the input voltage of the converter rather than the output voltage. It should be appreciated that the energy recovery dc-dc converter circuit 100 of FIG. 2F is an example of one possible converter design that may be used within an energy recovery system in an embodiment. Other converter designs may be used in other implementations.

As described previously, one of the functions of the dc-dc converter system 12 of FIG. 1 is to convert the dc output signal of the rectifier(s) to a useable dc output voltage. As used herein, the phrase "useable dc output voltage" and similar terms refer to voltages that are useable to perform some desired function. In various implementations, the dc output voltage of the converter may be used to, for example, power other circuitry or devices, charge a battery, provide power to a power amplifier and/or to control circuitry, or perform some other function. In each case, the dc-dc converter system may be used to generate a dc output voltage that is useable to support the corresponding function.

As described above, one component in the energy recovery system 10 of FIG. 1 is the rectifier circuit that converts RF to dc. As shown in FIG. 1, in some implementations, a plurality of rectifiers 14 may be used to provide the overall conversion from RF to dc. A plurality of rectifiers may be used for multiple reasons. First, devices capable of efficient rectification at microwave frequencies are often small and, therefore, may not be able to handle the needed power levels individually. Second, it is often easier to take advantage of circuit parasitics (or mitigate parasitics) for smaller rectifier devices than for larger ones. In addition, as will be described in greater detail, use of a plurality of rectifiers permits a rectifier system to be constructed that provides lower effective input impedance variation than is provided by a single rectifier.

In the discussion that follows, the design of individual tuned rectifier circuits will be described. Techniques for integrating multiple rectifier circuits into a rectification system will be described later. It is desired to have a rectifier that provides approximately resistive effective input impedance (i.e., having the fundamental component of RF voltage substantially in phase with fundamental RF current at the rectifier input port) with as little variation in effective impedance (ratio of fundamental voltage to current) as possible across operating conditions. As is known in the art, the effective impedance presented by a rectifier is a function of power and rectifier output voltage. Moreover, with conventional rectifiers (e.g., implemented with diodes), even the small parasitics associated with device capacitance, package capacitance and package inductance can cause substantial deviations from resistive input impedance. To address these challenges, in at least one embodiment, rectifiers incorporating tuned networks are used, where the tuned networks incorporate device and/or package parasitics to achieve the desired operating characteristics. Such tuned or resonant rectifiers can provide nearly resistive input resistance characteristics across a wide power range (e.g., impedance phase magnitude of less than 20 degrees over more than a 5:1 power range, etc.).

Figure 3A:
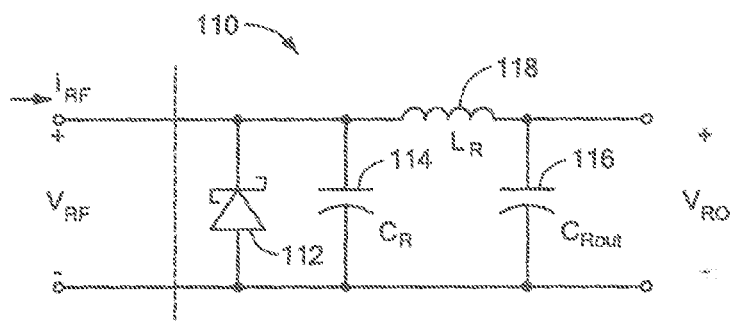
FIGS. 3A-3F are schematic diagrams illustrating tuned rectifier circuits that use diodes to perform rectification in accordance with various embodiments.

FIG. 3A is a schematic diagram of an exemplary tuned rectifier circuit 110 in accordance with an embodiment. The tuned rectifier circuit 110 is shown using a Schottky diode 112, but other device types may also be used (e.g., lateral field-effect rectifiers, etc.). Capacitor 114 represents a capacitance ($C_R$) including one or more of diode capacitance, diode package capacitance, and added circuit capacitance, and forms part of the tuning network. Capacitor 116 represents the rectifier output capacitance ($C_{ROUT}$). It provides a low impedance to RF, yielding approximately constant voltage at the rectifier output. Inductor 118 represents the rectifier inductance ($L_R$) which also forms part of the tuned network. The value of the rectifier inductance ($L_R$) may include diode package inductance.

In one approach, inductor 118 may be tuned near resonance with capacitor 114 (e.g., $L_R$ on the order of $1/(4\pi^2 f^2 C_R)$). For a given value of $C_R$, the exact value of $L_R$ can be selected using simulation software, such as SPICE. The network is loaded with a specified fixed output voltage $V_{RO}$ and driven with a sinusoidal input current $I_{RF}$ (at the design frequency), with $L_R$ selected such that the fundamental of $V_{RF}$ is nearly in phase with $I_{RF}$ for a range of current amplitudes. One may adjust the value of $C_R$ (by changing discrete capacitance, diode size, etc.) and subsequently retune $L_R$ in order to achieve resistive operation of the rectifier at a desired range of power levels (and to best utilize the rectifier device capabilities). In some cases, to achieve the best resistive input impedance across power, a small reactance may be added (inductive or capacitive, not shown) in series with the positive RF input terminal of the rectifier 110. This optional reactance, which would typically be much smaller than the reactance of $L_R$ or $C_R$, can be used to offset any residual reactance from the tuning process.

Figure 3B:
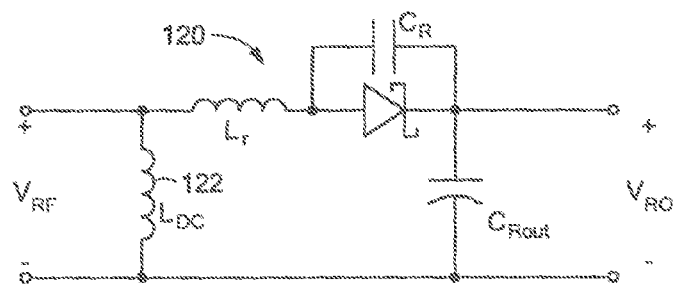

FIG. 3B is a schematic diagram illustrating an exemplary tuned rectifier circuit 120 in accordance with an embodiment. In tuned rectifier 120, $C_{ROUT}$ is again the rectifier output capacitance, which provides a low impedance at the operating frequency. $C_R$ is the resonant capacitance and incorporates the diode capacitance, and $L_R$ is the resonant inductance and may incorporate diode package inductance. In general, there needs to be a dc current path at the rectifier input. In the embodiment of FIG. 3B, this path is provided by an explicit inductor (i.e., optional choke inductance 122 ($L_{DC}$)) across the input terminals. In other embodiments, elements external to the rectifier 120 may be used to provide the dc current path. Tuning of this rectifier 120 may be carried out in a similar manner to the rectifier of FIG. 3A. However, instead of driving the rectifier circuit 120 with a sinusoidal current during tuning, the circuit may be driven with a sinusoidal voltage while observing the fundamental of the rectifier input current.

Figure 3C:
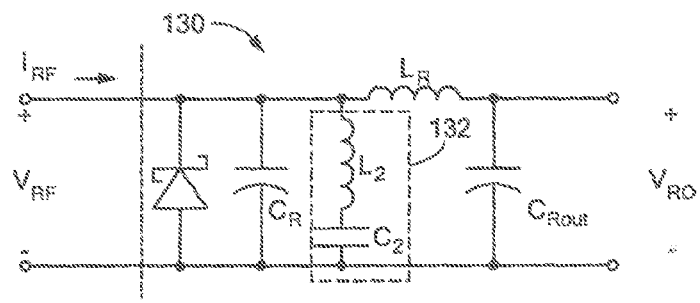
Figure 3D:
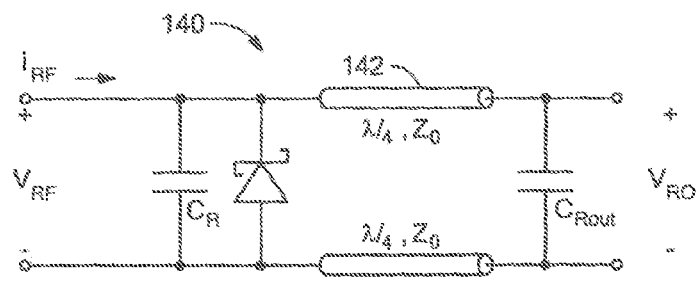
Figure 3E:
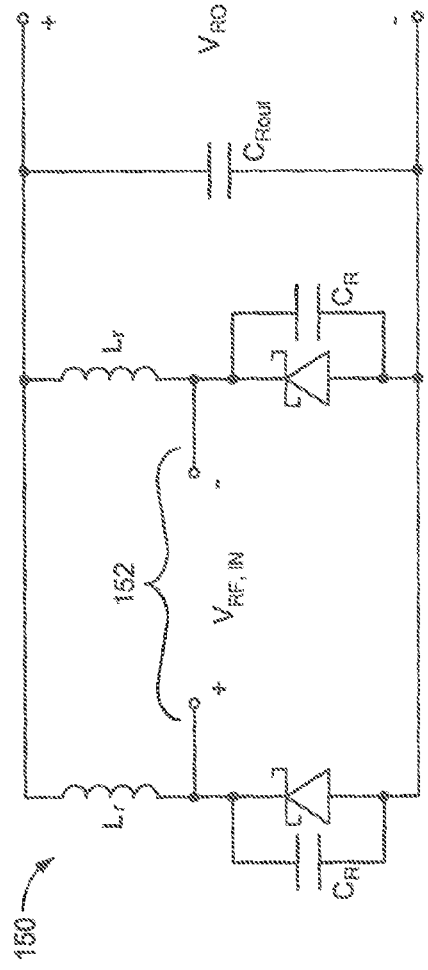

In some implementations, rectifier circuits may be provided that also include tuning for higher-order harmonics. FIG. 3C is a schematic diagram illustrating such a tuned rectifier circuit 130 in accordance with an embodiment. As illustrated, the rectifier circuit 130 of FIG. 3C includes a series tank 132 having an inductance L2 and a capacitance C2 tuned at the second harmonic to reduce device voltage stress. Rectifier circuits may also be provided that use transmission-line sections to perform some or all of the tuning function. For example, FIG. 3D is a schematic diagram illustrating a tuned rectifier circuit 140 using transmission line segments in accordance with an embodiment. As illustrated, the rectifier circuit 140 of FIG. 3D includes a quarter-wavelength line segment 142 to provide reduced voltage stress. In some implementations, the line length of this segment may be adjusted slightly longer or shorter than a quarter wavelength to compensate for rectifier device capacitance and/or inductance. FIG. 3E is a schematic diagram illustrating a class E/F rectifier 150 having a differential input port 152 in accordance with an embodiment. This rectifier circuit 150 can be driven differentially, or its input can be converted to a single-ended port using a splitter/combiner. It will be appreciated that other types of tuned rectifier circuit may be used, including those with other harmonic tunings, and those incorporating multiple diodes. In general, the tuning of a rectifier may involve selecting the inductances and capacitances such that the ac current (or voltage) at the rectifier input is substantially in-phase with the ac voltage (or current) at the rectifier input for the frequency of interest.

Figure 3F:
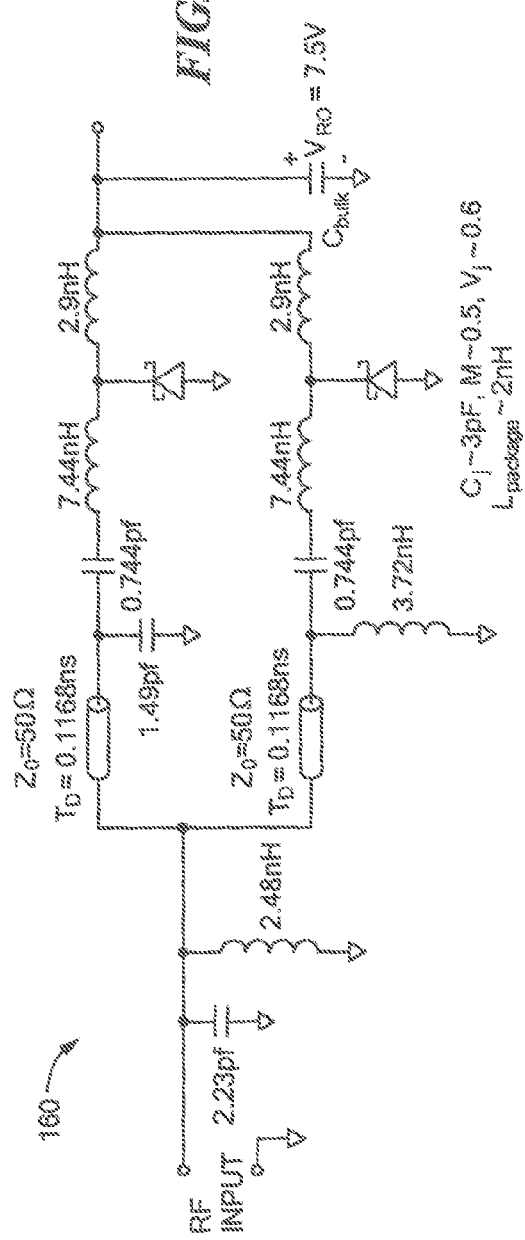

FIG. 3F is a schematic diagram illustrating a resistance compressed rectifier system 160 having a pair of tuned rectifiers preceded by a resistance compression network having a pair of 50 ohm transmission line segments in accordance with an embodiment. The resistance compression network acts as an RF input network for the tuned rectifiers (although additional RF input network circuitry may be added in some implementations). The resistance compressed rectifier system 160 of FIG. 3F is operative at 2.14 GHz with a dc output voltage of 7 V and an RF input impedance near 50 Ohms.

Figure 4A:
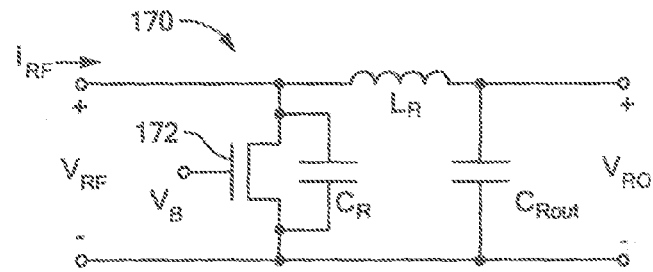
FIGS. 4A-4B are schematic diagrams illustrating tuned rectifier circuits that use transistors to perform rectification in accordance with various embodiments.
Figure 4B:
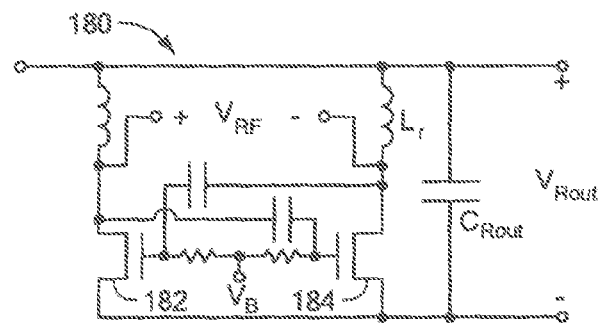

While the tuned rectifier circuits of FIGS. 3A-3F are shown with Schottky diodes, it should be appreciated that other diode types or device types may be employed in other implementations to perform the rectification function. In some implementations, for example, transistors may be used to provide rectification (e.g., MOSFETs, JFETs, HEMTs, HBTs, etc.). FIG. 4A is a schematic diagram illustrating a tuned rectifier circuit 170 that uses a transistor 172 to perform rectification in accordance with an embodiment. As illustrated in FIG. 4A, to perform rectification, the gate of the transistor 172 may be biased to an appropriate dc potential (e.g., $V_B$). Alternatively, the gate terminal may be actively driven at RF to provide synchronous rectification (e.g., $V_B$ in FIG. 4A may include a dc bias plus an RF signal with appropriate phase relative to $V_{RF}$). FIG. 4B is a schematic diagram illustrating a tuned rectifier circuit 180 that performs synchronous rectification using transistors 182, 184 that are "cross-driven" from the RF input signal itself. In general, synchronous rectification involves turning a transistor on and off with timing such that it carries an average dc current, thus providing conversion from an ac input to a dc output. In one approach, each transistor gate may be driven such that the transistor conducts current of substantially one polarity, and is turned off otherwise. That is, the transistor may be driven to conduct in a manner similar to a diode, but having a lower device drop than a diode.

Another component in the energy recovery system of FIG. 1 is the RF input network 16 that addresses challenges associated with capturing RF energy. These challenges include the generation of undesired frequencies by the rectifiers, the need to operate with small individual rectifier devices, rectifier input impedance variations, operation at high peak-to-average power ratios, and energy capture at circuit ports that are not referenced to a common potential. As will be described below in greater detail, each of these challenges may be addressed by specific elements of the RF input network.

Figure 5:
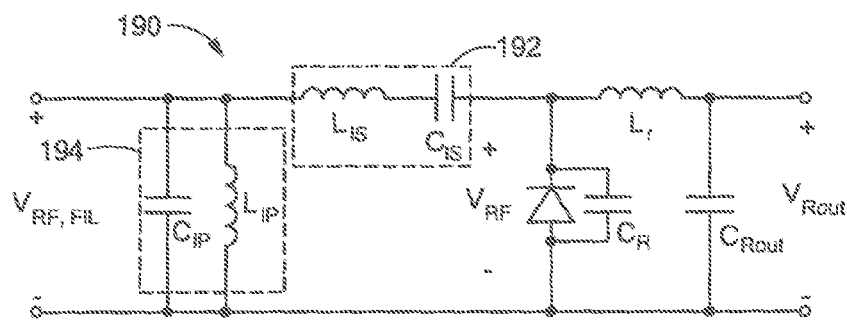
FIG. 5 is a schematic diagram illustrating a rectifier circuit having a series tank and a parallel tank coupled to an input thereof in accordance with an embodiment.

A byproduct of the rectification process is often the presence of dc, switching harmonics, and other undesired frequency components at the rectifier inputs. These undesired frequency components can cause deleterious effects in the energy recovery system. For example, the unwanted frequency content can pollute the system that the energy recovery system is connected to, can cause undesired interactions among the multiple rectifier circuits, as well as other negative effects. To suppress this content, filtering may be provided at the rectifier inputs and possibly at points closer to the energy recovery system input. In some embodiments, these filters may include tuned series and/or parallel tanks in series with the rectifier inputs (and/or interconnections) or in parallel with the rectifier inputs. For example, FIG. 5 is a schematic diagram illustrating a rectifier circuit 190 having a series tank 192 and a parallel tank 194 coupled to an input thereof, where the series tank 192 is tuned to the input frequency to pass through the desired fundamental and the parallel tank 194 is tuned to the input frequency to suppress unwanted content. Other bandpass and/or bandstop filtering (e.g., tuned to harmonics) may also be employed, as well as low-pass and high-pass filters to suppress undesired content. These filters may be implemented with discrete or integrated passive components, with transmission-line sections, or as a combination of these elements.

As described previously, better rectifier performance can sometimes be achieved at RF frequencies using rectifier devices that are small in power rating and physical size, making it advantageous to construct an energy recovery system from multiple rectifiers of reduced power rating. Moreover, utilizing a plurality of rectifiers, one can construct a rectifier system providing lower effective input impedance variation than is provided by a single rectifier, as described in detail below. To implement a multi-rectifier system, in at least one embodiment, the RF input network may include a power dividing and impedance shaping network that splits power among the various rectifiers and provides an input impedance that varies over a smaller range (e.g., a ratio of input resistances or input impedance magnitudes) than the individual rectifiers. Desirable attributes of such a power dividing network include relatively even power splitting among the individual rectifiers and lossless or very low loss operation.

Figure 6A:
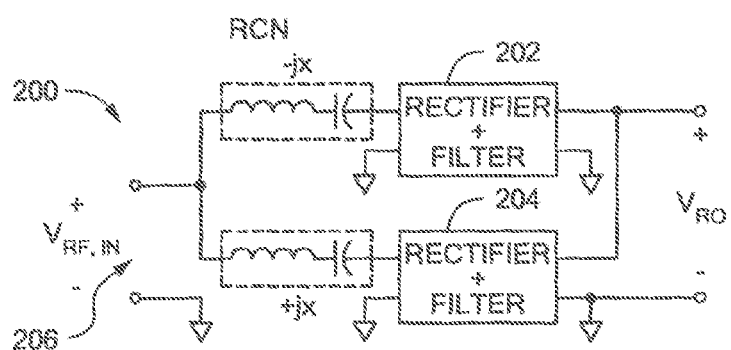
FIG. 6A is a schematic diagram illustrating an example resistance compression network (RCN) that may be used to provide power dividing and impedance shaping at the input of an energy recovery system in accordance with an embodiment.

In some embodiments, a resistance compression network (RCN) may be used to provide the power dividing and impedance shaping network of the RF input network. FIG. 6A is a schematic diagram illustrating an exemplary resistance compression network 200 that may be used in an embodiment. This network is ideally lossless and splits input power among two rectifiers 202, 204 approximately equally, while providing a resistance at its input port 206 that varies over a smaller range than the individual rectifiers 202, 204. This thus forms a "resistance-compressed rectifier system." The compression branch impedance magnitude X is selected based on the input impedance range provided by the rectifiers 202, 204. In constructing RCNs of the type in FIG. 6A for operation at microwave frequencies, care should be taken to minimize or compensate (e.g., "resonate out") shunt parasitics at the intermediate nodes (e.g., between the inductors and capacitors).

Figure 6B:
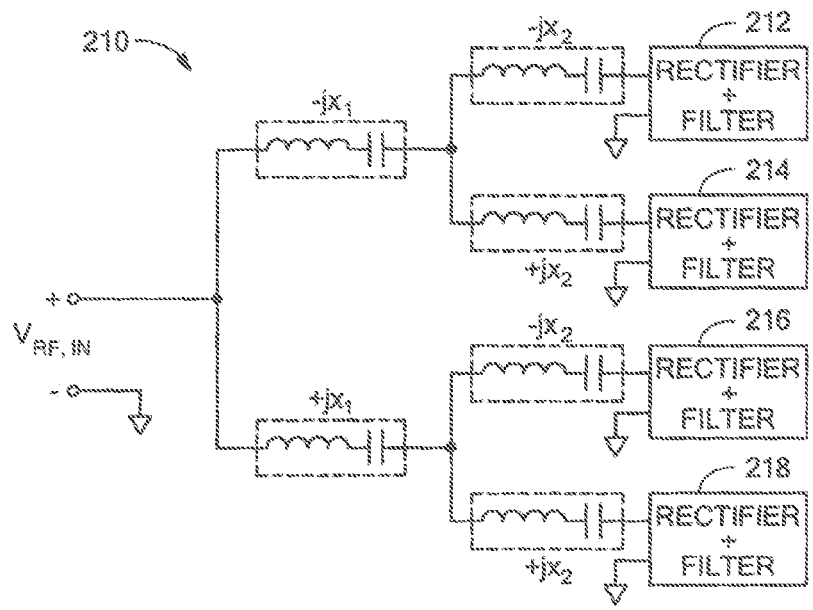
FIG. 6B is a schematic diagram illustrating a higher order RCN that may be used to provide power dividing and impedance shaping at the input of an energy recovery system in accordance with an embodiment.

The resistance compression network 200 of FIG. 6A, constructed with discrete components, has the benefits of being compact and providing good operational bandwidth. Higher-order resistance compression networks (or "multilevel" compression networks) can also be used, such as the "second order" (or two-level) RCN 210 of FIG. 6B that can split power among four rectifier circuits 212, 214, 216, 218. An RCN of order M, or an M-level RCN, can split power among N=2M rectifier circuits. Other RCN variants may alternatively be used, including RCNs that are achieved by topological duality or star-delta transformations of the network elements, RCNs that use different component types to realize the needed reactances, and RCNs that use circuit board or microstrip elements.

Power dividing and resistance compression can also be achieved with circuits incorporating transmission-line sections (e.g., section of microstrip, etc.). FIG. 6O is a schematic diagram illustrating a resistance compression network 230 that uses quarter wavelength transmission line sections 236, 238 and reactances 240, 242 to perform resistance compression for first and second rectifiers 232, 234. In resistance compression network 230, the reactive components 240, 242 may be realized as discrete components, components implemented in the circuit board, or as transmission-line stubs. In this embodiment, in addition to working with the shunt elements to realize resistance compression, the characteristic impedance of the quarter-wave lines 236, 238 can be selected to provide a desired degree of impedance transformation, FIG. 3F described previously illustrates the details of an example implementation of a resistance-compressed rectifier system 160 that uses the resistance compression network architecture illustrated in FIG. 60.

Figure 6C:
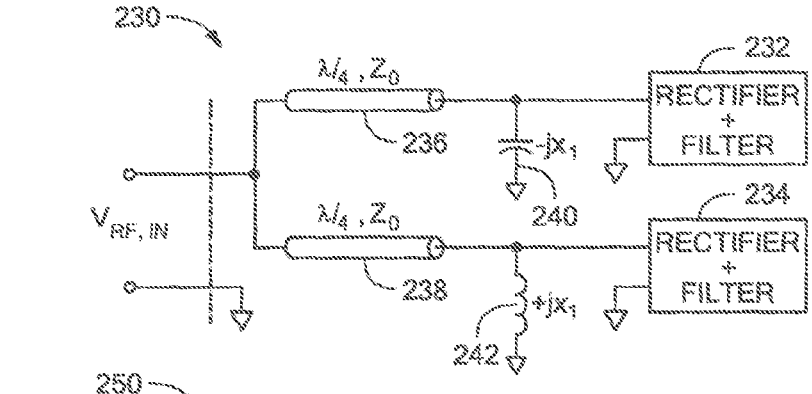
FIG. 6C is a schematic diagram illustrating an RCN that utilizes transmission-line sections and reactances to provide power dividing and impedance shaping at the input of an energy recovery system in accordance with an embodiment.
Figure 6D:
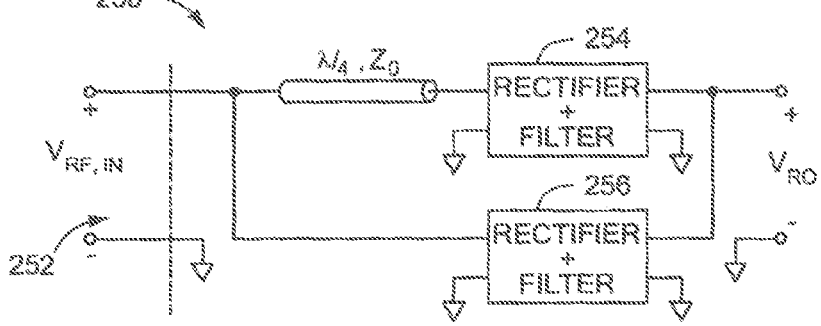
FIG. 6D is a schematic diagram illustrating a network that provides un-equal power sharing and impedance shaping at the RF input of an energy recovery system in accordance with an embodiment.

The power dividing and impedance shaping network of the RF input network may also be implemented using other network types and topologies. For example, FIG. 6D is a schematic diagram illustrating a network 250 that serves to provide a degree of impedance shaping such that the impedance at the RF input 252 varies over a smaller range (e.g., ratio of input resistances or input impedance magnitudes) than the individual rectifiers 254, 256, though it does not cause power to be shared equally among the rectifiers 254, 256 across operating conditions. The network 250 can be extended for use with additional rectifiers by paralleling additional rectifier-loaded quarter-wave-line branches having different characteristic impedances and appropriately designed rectifiers.

Figure 6E:
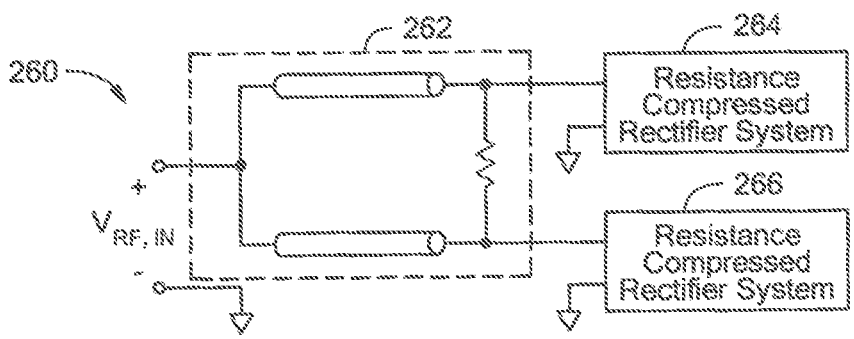
FIG. 6E is a schematic diagram illustrating a network that may be used to provide additional power division using an isolating power splitter to divide power among multiple resistance-compressed rectifier systems in accordance with an embodiment.

Additional power dividing can be obtained using networks that are not ideally lossless and/or which do not provide reduction in impedance range. For example, power may be split further using an isolating power splitter to divide up power to multiple resistance-compressed rectifier systems. FIG. 6E illustrates a network 260 that uses a two way splitter 262 (e.g., a Wilkinson splitter, a Gysel splitter, a hybrid splitter, etc.) to split power between first and second resistance-compressed rectifier systems 264, 266. Many-way splitters can be used when there are more than two resistance-compressed rectifier systems. While providing power dividing in this fashion does not provide additional reduction in impedance ranges, it can be made highly efficient, and the isolation helps soften the variations in input impedance. Moreover, it enables systems of different energy recovery power capacities to be simply constructed.

Figure 7A:
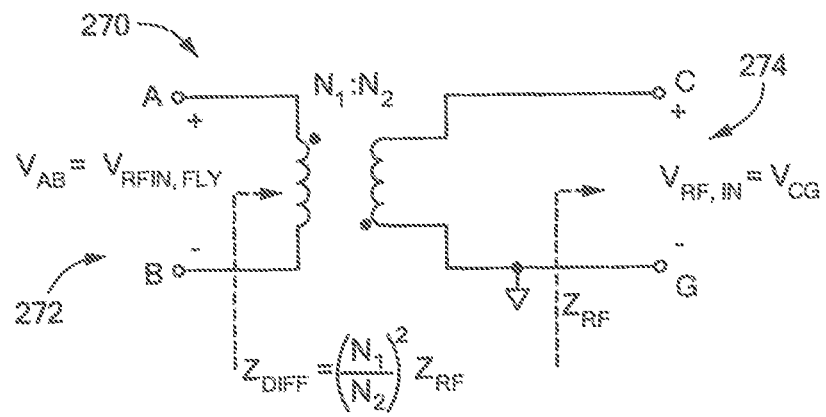
FIGS. 7A and 7B are schematic diagrams illustrating conversion networks that may be used to transfer energy from a floating input voltage port to a common-referenced output port in accordance with embodiments.

In some embodiments, the RF input port of an energy recovery system is referenced to a common potential (e.g., ground, etc.). However, in some cases, the input port may be "differential" or floating (or "flying") with respect to system ground, while the recovered energy must be provided at an output port that is referenced to system ground. For example, the isolation port of a Wilkinson combiner is not ground referenced, but represents a "differential" input. One technique to recover energy at a floating or "flying" input port involves the use of an RF transformer or balun to transfer energy from the flying input voltage to a common-referenced port. FIG. 7A is a schematic diagram illustrating an example conversion network 270 for doing this in accordance with an embodiment. If such an approach is used, the energy may be recovered at the common-referenced port as described above. In the embodiment of FIG. 7A, energy at port AB 272 is delivered to output port CG 274 with $V_{CG}=(N_2/N_1) \cdot V_{BA}$. If the effective turns ratio is not unity, network 270 also provides an impedance transformation such that $Z_{diff}=(N_1/N_2)^2 \cdot Z_{RF}$. Depending on dc levels, one or both of the ports 272, 274 may require a series blocking capacitor, and one may also need to tune out transformer parasitics (such as leakage inductances and/or magnetizing inductance) at the RF frequency of interest (e.g., using capacitors).

Figure 7B:
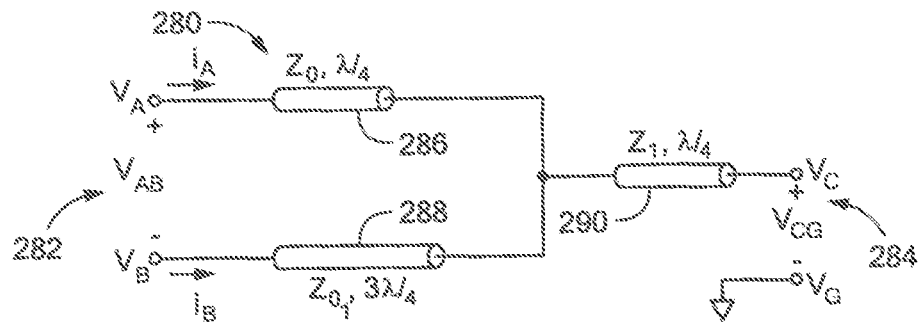

Another technique to transfer energy from a "flying" input port to a common-referenced port for energy recovery purposes involves the use of transmission-line sections. FIG. 7B is a schematic diagram illustrating an example conversion network 280 that uses transmission line sections 286, 288, 290 to transfer energy between ports in accordance with an embodiment. At the design frequency, conversion network 280 transfers energy from a floating port 282 to a common-referenced port 284 according to the relationship $V_{CG}=(Z_1/Z_0) \cdot V_{BA}$. Network 280 can provide both a differential to single-ended conversion and an impedance transformation, such that $Z_{diff}=(Z_0/Z_1)^2 \cdot Z_{RF}$. In some cases, the $Z_1$ transmission line section can be omitted. For example, in cases where the load provided by the energy recovery system is at or near impedance $Z_1$, the transmission section can be omitted. Similarly, in cases where the impedance inversion provided by the quarter-wave section 290 is not a problem, this transmission line section can be omitted. Also, it will be recognized that blocking capacitors may be used in series with one or more of the terminals of the differential conversion network in some implementations. Note that the network can also be implemented with lumped transmission-line approximations, with other immittance converting circuits taking the function of each quarter-wave section, or combinations of lumped and distributed structures serving the same or similar functions.

Other alternative techniques for converting "flying" or differential inputs to common-referenced outputs for energy recovery can be utilized in other embodiments. Combined with the other portions of the energy recovery system, these techniques enable RF energy to be recovered from "flying" ports.

Figure 8A:
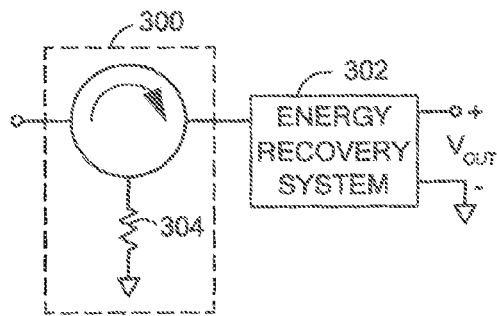
FIG. 8A is a schematic diagram illustrating an energy recovery system using an isolator as part of the energy recovery system input network in accordance with an embodiment.

It is recognized that even with filtering, some applications may be sensitive to any reflected power from the energy recovery system (including at the operating frequency, harmonics, or other frequencies). In such cases, an isolator may be used as part of the energy recovery input network to terminate any reflected power generated by the energy recovery system. As shown in FIG. 8A, an isolator 300 may be placed at the input of an energy recovery block 302 so that reflections from the input are directed to termination 304. It should be appreciated that other isolator locations are also possible.

Figure 8B:
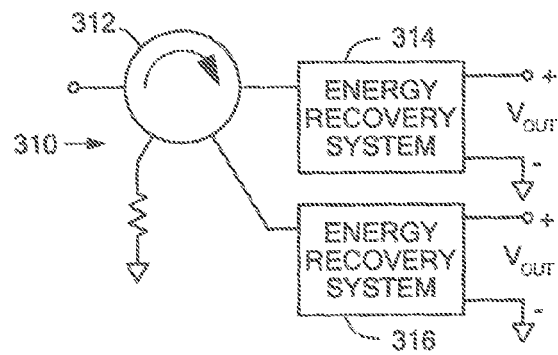
FIG. 8B is a schematic diagram illustrating an energy recovery system using a circulator and providing "multilevel" isolation and energy recovery in accordance with an implementation.

FIG. 8B is a schematic diagram illustrating an energy recovery system 310 that uses an isolator 312 to provide "multilevel" isolation and energy recovery in accordance with an implementation. As shown, a number of energy recovery blocks 314, 316 are coupled to ports of isolator 312. Each energy recovery block 314, 316 incorporates one or more energy recovery rectifiers and possibly other subsystems, as described above. Multilevel isolation provides the opportunity to capture RF power at different power levels and contents, and may be implemented with a 4 or more port circulator and a terminating resistor, or a cascade of 3-port circulators and a terminating resistor.

The availability of an energy recovery system also enables additional functions and features to be realized. One such function is power monitoring. For example, an additional circuit can be provided that monitors information about the energy recovery system, such as the input and/or output power of the system. In some implementations, the system output power is monitored using the sensing and/or control signals of the energy recovery dc-dc converter, in some other implementations, the output power may be monitored using additional low-frequency sensors or other structures. In at least one embodiment, the input power may be monitored based on the operating point of the rectifier circuits. Alternatively, the input power may be monitored based on the operation of the energy recovery converter (e.g., estimating input power based on the known characteristics of the system and the converter input or output current, voltage, or power or rectifier input or output voltage, current, or power). Additional monitoring circuitry may also be provided in some embodiments. This may include, for example, circuitry for monitoring system temperature, operating status, and/or other critical operating parameters.

Many RF circuits incorporate power resistors that dissipate energy during circuit operation. Such circuits include RF hybrids, power combiners and dividers, isolators, RF power amplifier systems, duplexers, filters and termination networks, among other devices. Each of these circuit types can benefit by incorporating the energy recovery techniques described herein. Likewise, many RF circuits seek to absorb energy from an antenna, transformer secondary, coil, or other means of receiving RF energy, including in rectenna systems, wireless power transfer systems, inductive power coupling systems, radio-frequency power converter systems including RF dc-dc converters, and microwave power transmission systems. It is desirable to be able to capture RF energy in these systems and convert it to useable form, while minimizing reflected or dissipated RF power. Each of these circuit types can likewise benefit by incorporating the energy recovery techniques described herein.

Figure 9A:
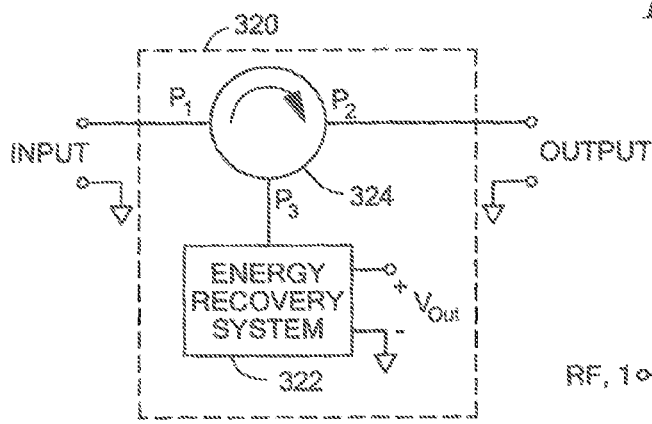
FIG. 9A is a block diagram illustrating an isolator system using energy recovery at a termination port thereof in accordance with an embodiment.

One type of circuit that can benefit from the described techniques is an isolator. FIG. 9A is a block diagram illustrating the use of an energy recovery system 322 (e.g., the energy recovery system of FIG. 1, etc.) as a termination for an isolator 320. As illustrated, the isolator 320 includes a circulator 324 having three ports, with the energy recovery system 322 coupled to one of the three ports (i.e., instead of a conventional resistive termination). A first port of the circulator serves as the input port of the isolator 320 and a second port serves as the output port. RF power delivered to the isolator input port is transferred to the isolator output port. Any power entering the isolator output port (e.g., power reflected back into the isolator output port from a mismatched load and/or any other power) is transferred to the energy recovery system 322 at the third port of the circulator 324. In this manner, the energy may be at least partially recovered for other uses instead of being lost to dissipation as would occur with a conventional resistive termination.

Figure 9B:
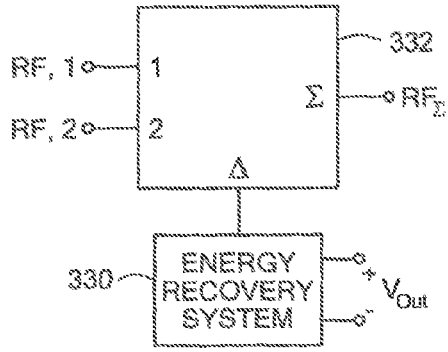
FIG. 9B is a block diagram illustrating a combiner/splitter using energy recovery in accordance with an embodiment.

Another application that can benefit from energy recovery is power combining and/or splitting. FIG. 9B is a block diagram illustrating the use of an energy recovery system 330 to provide energy recovery for a combiner/splitter 332 in accordance with an embodiment. The combiner/splitter 332 may include, for example, a rat-race hybrid, a branchline hybrid, a 90 or 180 degree hybrid, or others.

In the illustrated embodiment, the combiner/splitter 332 includes four ports: port 1, port 2, a sum port, and a difference (delta) port. The energy recovery system 330 may be coupled to either the sum port or the difference port. The energy recovery system 330 may provide, for example, a proper termination for the corresponding port (e.g., the difference port in FIG. 9B) while the other port (e.g., the sum port in FIG. 9B) is used as a "combined" port. In this manner, combining and/or splitting may be achieved between the combined port and ports 1 and 2, while energy is recovered for isolation at the energy recovery output port.

Figure 9C:
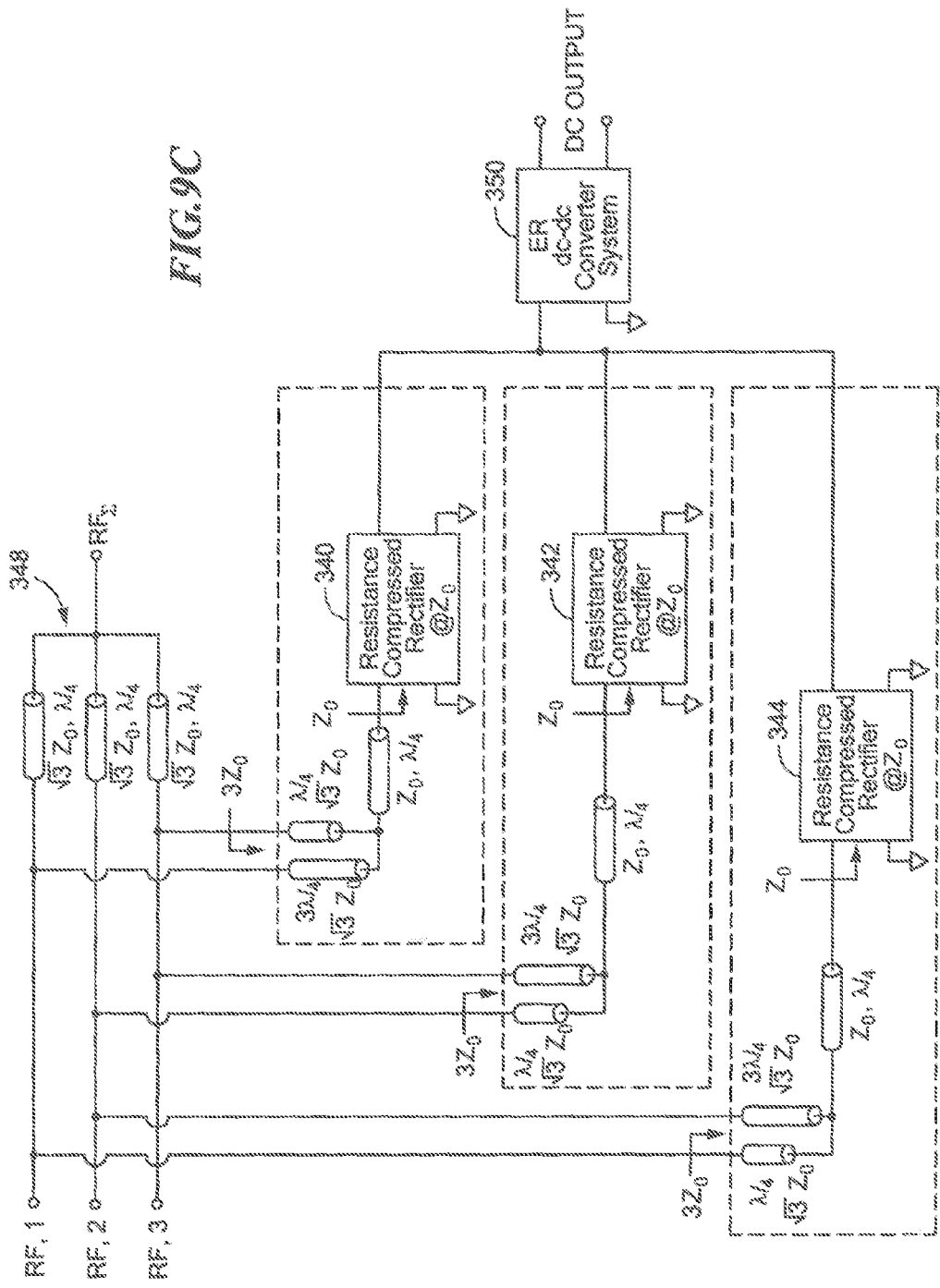
FIG. 9C is a block diagram illustrating a combiner/splitter using energy recovery that utilizes differential to single-ended conversion in the energy recovery system in accordance with an embodiment.

In some systems, three (or more) way combining/splitting may be used. FIG. 9C is a block diagram illustrating an implementation that utilizes differential to single-ended conversion in an energy recovery system. The combiner/splitter 348 is implemented as a 3-way Wilkinson combiner/splitter with the ports for isolation (with energy recovery) connected in delta, where each differential input port has an apparent input resistance of approximately $3Z_o$. This system uses three energy recovery rectifier systems 340, 342, 344, each including differential-to-single-ended conversion. The system may also include an RF input network comprising impedance shaping, filtering, distribution, and a plurality of rectifiers, along with a single energy recovery dc-dc converter system 350 to provide recovered energy at the output. In an alternative approach, this system can be reconfigured such that there is a separate energy recovery dc-dc converter for each of the energy recovery systems. This technique may be used for splitting or combining any number of signals.

Another application that can benefit from the energy recovery techniques described herein is power amplification. More specifically, systems where power from multiple power amplifiers is combined to create a single higher power signal. FIG. 9D is a block diagram illustrating an example power amplification system 400 using energy recovery in accordance with an embodiment. As shown, output power from two power amplifiers 402, 404 is combined using an isolating combiner 406 with energy recovery (e.g., as illustrated in FIG. 9B). Depending on the relative magnitude and phase of the outputs of the two power amplifiers 402, 404, power will be delivered to one or both of first and second output ports of the combiner 406. The first output port is illustrated as the sum port and the second output port is illustrated as the difference port in FIG. 9D. An energy recovery system 408 may be connected to the second output port. This provides the opportunity to load the power amplifiers 402, 404 in an isolating fashion, and at the same time control power (and signal amplitude and phase) delivered to the output port by adjusting the magnitudes and phases of the outputs of the individual power amplifiers 402, 404. Power not delivered to the output port is recovered through the energy recovery system 408 (minus any losses). The magnitudes and phases of the outputs of the individual PAs 402, 404 may be controlled by, for example, any one or more of: (1) individually adjusting one or more of the pulse widths, timing, drive amplitudes, and phases of the power amplifier input signals (e.g., including amplitude modulation, phase-shift or outphasing modulation, PWM modulation, and on/off modulation), (2) individually adjusting the power supply bias voltages of the power amplifiers (e.g., via discrete or continuous drain modulation), (3) load modulation of the individual power amplifiers (e.g., by implementing each power amplifier as a Doherty amplifier or an outphasing amplifier with lossless combining), and/or other techniques. It should be recognized that such a system can also be realized with a larger number of power amplifiers, such as by using the combining and energy recovery system illustrated in FIG. 9C. Such a system enables high efficiency linear control of output power by adjusting the relative operation of the individual power amplifiers.

A power amplifier system with multiple power amplifiers can also be implemented as a balanced power amplifier system that realizes improved efficiency under load mismatch (e.g., from a non-ideal load impedance) at its output port. FIG. 9E is a block diagram illustrating an exemplary system 420 of this type. In system 420, reflected power from an output port of a balanced amplifier 422 is captured by an energy recovery system 424. The recovered energy is provided at a dc output port 426 and may be used to supply part of the power to the power amplifiers 428, 430 of balanced amplifier 422, for powering computation or control circuitry, powering pre-amplifiers, and/or for other uses. The system 420 of FIG. 9E includes a first 90-degree hybrid 440 to provide appropriate phases at the two power amplifier inputs, and a second 90-degree hybrid 442 to combine power from the two power amplifiers 428, 430 for delivery to an RF output port. The energy recovery system 424 is connected to the isolation port of the second hybrid 442. Reflected power entering the output port (e.g., owing to load mismatch) can be substantially captured by the energy recovery system 424, thus providing improved operation under load mismatch.

Resistance compression networks (RCNs) absorb energy from a source and deliver it (ideally losslessly) to a plurality of loads (e.g., such a set of rectifiers), providing an input resistance that varies over a narrow range as the resistance of the loads vary together over a wide range. Resistance compression networks can also serve to reduce the phase of the input impedance as compared to the phase of the load impedances (phase compression). Ideally, the RCN splits input power substantially equally among the loads. Conventional resistance compression networks use reactances to accomplish this, and may additionally include transmission-line sections, as illustrated in FIGS. 3F and 6C. The reactances themselves may be implemented as transmission-line sections or stubs or otherwise realized in printed-circuit form.

In some embodiments, resistance compression networks may be implemented using transmission-line sections having asymmetric lengths, wherein the transmission-line sections are provided as two-port structures interconnecting among the source and loads. Such Transmission-Line Resistance Compression Network (TLRCN) implementations may provide several benefits. For example, they can (a) have low loss, (b) enable repeatable, low-cost implementation using printed circuit techniques, (c) provide filtering, and (d) with correct length selections, they can provide resistance compression at one or more harmonic frequencies. Moreover, at UHF frequencies and above, the discrete reactances often used in conventional RCN designs represent an increasing challenge. That is, the transmission-line effects associated with their physical size can substantially influence system behavior, and their numerical values can become extremely small, making them difficult to implement accurately and making the system susceptible to parasitic effects. TLRCN implementations, on the other hand, avoid these issues by directly realizing the RCN as a transmission-line structure interconnecting the source and loads.

Figure 10A:
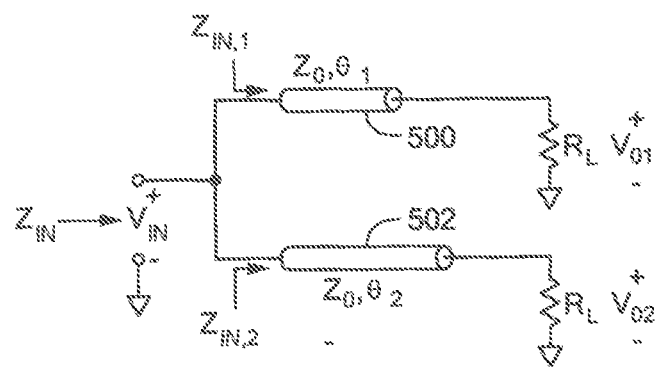
FIG. 10A is a schematic diagram illustrating a transmission-line resistance compression network (TLRCN) providing power dividing and impedance shaping and having an input port and two output ports, with the output ports loaded with a pair of resistive loads.

A description will now be made of the theory and operating characteristics of Transmission-Line Resistance Compression Networks. With a TLRCN network, substantially balanced splitting of power to multiple loads and smaller variation in driving point resistance as compared to load resistance variation may be achieved using only transmission-line sections used as two-port devices to connect among the sources and loads. FIG. 10A shows a basic TLRCN structure, having a single input port with voltage $v_{IN}$ and two output ports with voltages $v_{O1}$ and $v_{O2}$, with the output ports loaded with identical resistive loads $R_L$. In each transmission-line section, or branch, in FIG. 10A the second terminal at each port of each transmission-line section may be treated as connected to a common potential at that end of the transmission-line section, as naturally occurs in a microstrip or other printed-circuit implementation, and is thus not shown explicitly. The first transmission-line branch 500 coupled to the input port has characteristic impedance $Z_0$ and a length $l_1$ corresponding to an electrical angular delay $\theta_1$ at an operating frequency of interest. The second transmission-line branch 502 coupled to the input port likewise has characteristic impedance $Z_0$ and a different length $l_2$ corresponding to an electrical angular delay $\theta_2$. (Implementation of systems in which the two branches have different characteristic impedances and which operate best with different loading impedances is also possible.) We can express the lengths of the two branches as a base length plus and minus a delta length (or a base angle+/−a delta angle) as follows:

$$l_1 = l_{Base} + \Delta l$$

$$l_2 = l_{Base} - \Delta l \quad (1)$$

$$\theta_1 = \theta_{Base} + \Delta\theta$$

$$\theta_2 = \theta_{Base} - \Delta\theta \quad (2)$$

We obtain desired operating characteristics at a frequency of interest by proper selection of $Z_0$, $\theta_{Base}$, and $\Delta\theta$.

While there are multiple possibilities for base lengths, we first consider a base length $l_{Base}$ of $\lambda/4$ (a quarter wavelength at a frequency of interest), corresponding to $\theta_{Base} = \pi/2$ radians. (Any base length with an additional multiple of $\lambda/2$ in length will provide similar results.) Considering the first and second branches 500, 502 in FIG. 10A individually, we find branch input admittances at the frequency of interest:

$$Y_{in,1} = \frac{1}{Z_{in,1}} = \frac{1}{Z_0} \cdot \frac{Z_0 - jR_L\cot(\Delta\theta)}{R_L - jZ_0\cot(\Delta\theta)} \quad (3)$$

$$Y_{in,2} = \frac{1}{Z_{in,1}} = \frac{1}{Z_0} \cdot \frac{Z_0 + jR_L\cot(\Delta\theta)}{R_L + jZ_0\cot(\Delta\theta)}$$

Since these admittances are complex conjugates, the network will divide power entering the input port equally to both loads (for identical load resistances). The impedance seen at the input port at the frequency of interest is resistive in this case, and can be shown to be:

$$Z_{in} = R_{in} \frac{|\cot(\Delta\theta)|}{2[1+\cot^2(\Delta\theta)]} \cdot \left[ \left\{ \frac{R_L}{|\cot(\Delta\theta)|} \right\} + \frac{Z_0^2}{\left\{ \frac{R_L}{|\cot(\Delta\theta)|} \right\}} \right] \quad (4)$$

Such a characteristic clearly realizes resistance compression: the input impedance is resistive and varies only over a small range as the load resistances vary together over a wide range. In fact, this input resistance characteristic bears close relation to the input resistance of a type of resistance compression network that uses reactances in series with the load networks (e.g., see FIG. 6A). With a design selection of $\Delta\theta = \pi/4$ radians ($\Delta l = \lambda/8$), the circuit provides identical characteristics (with the transmission-line characteristic impedance $Z_0$ taking the place of reactance X in the expression for the input resistance).

Using the above-described network with a base angle of $\theta_{Base} = \pi/2$, "balanced" compression can be achieved for a range of load resistances having a geometric mean of $R_{L,center}$:

$$R_{L,center} = Z_0 \cdot |\cot(\Delta\theta)| \quad (5)$$

At this load resistance value ($R_{L,center}$), the input resistance takes on a minimum value of $R_{in,min}$, with larger input resistance for other load resistances. The value of $R_{in,min}$ may be calculated as follows:

$$R_{in,min} = Z_0 \cdot \frac{|\cot(\Delta\theta)|}{[1+\cot^2(\Delta\theta)]} \quad (6)$$

Figure 10B:
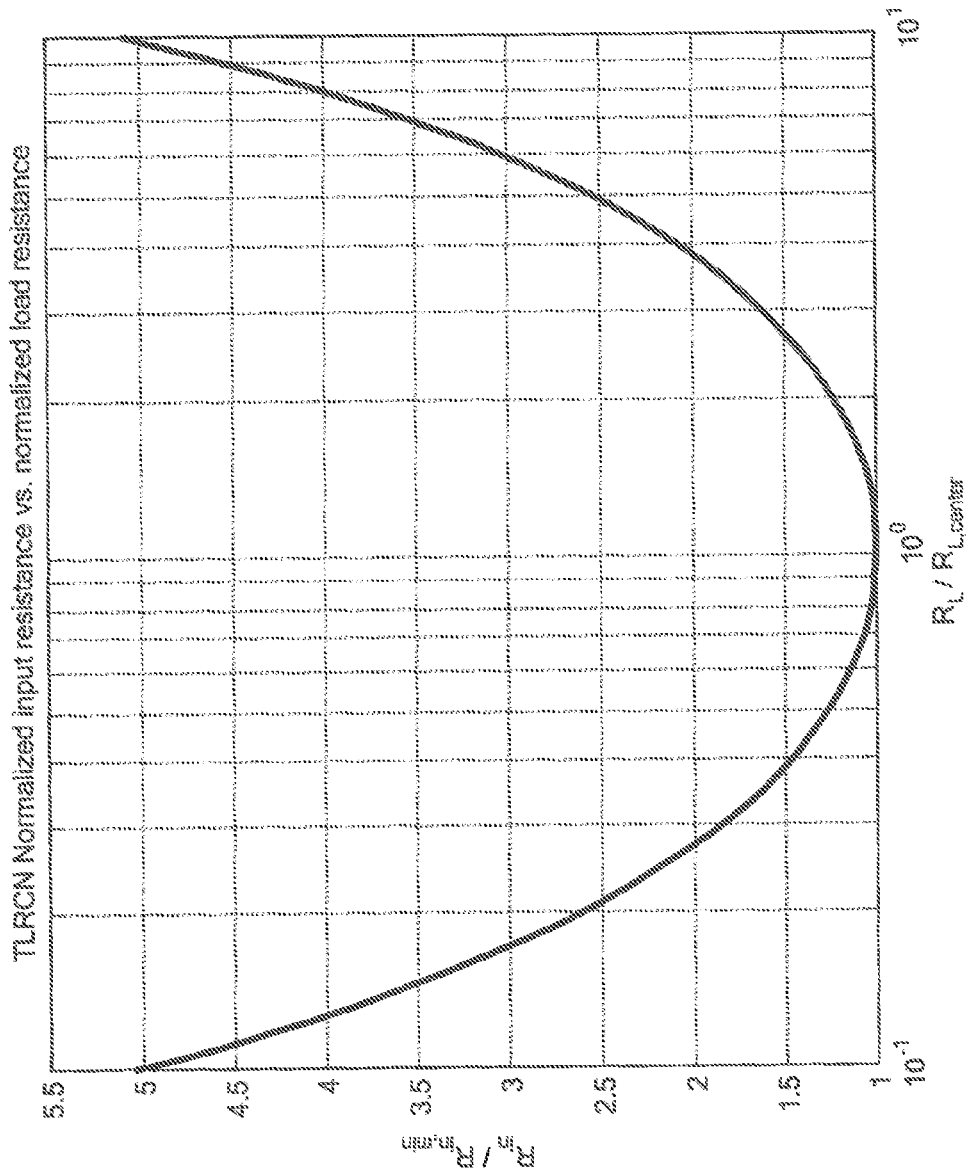
FIG. 10B is a plot of the normalized input resistance versus the normalized load resistance for a single-level transmission-line resistance compression network, with the normalized load resistance plotted on a log scale.

FIG. 10B shows a plot of the input resistance (normalized to $R_{in,min}$) as a function of the load resistance (normalized to $R_{L,center}$), with the normalized load resistance on a log scale.

Figure 10C:
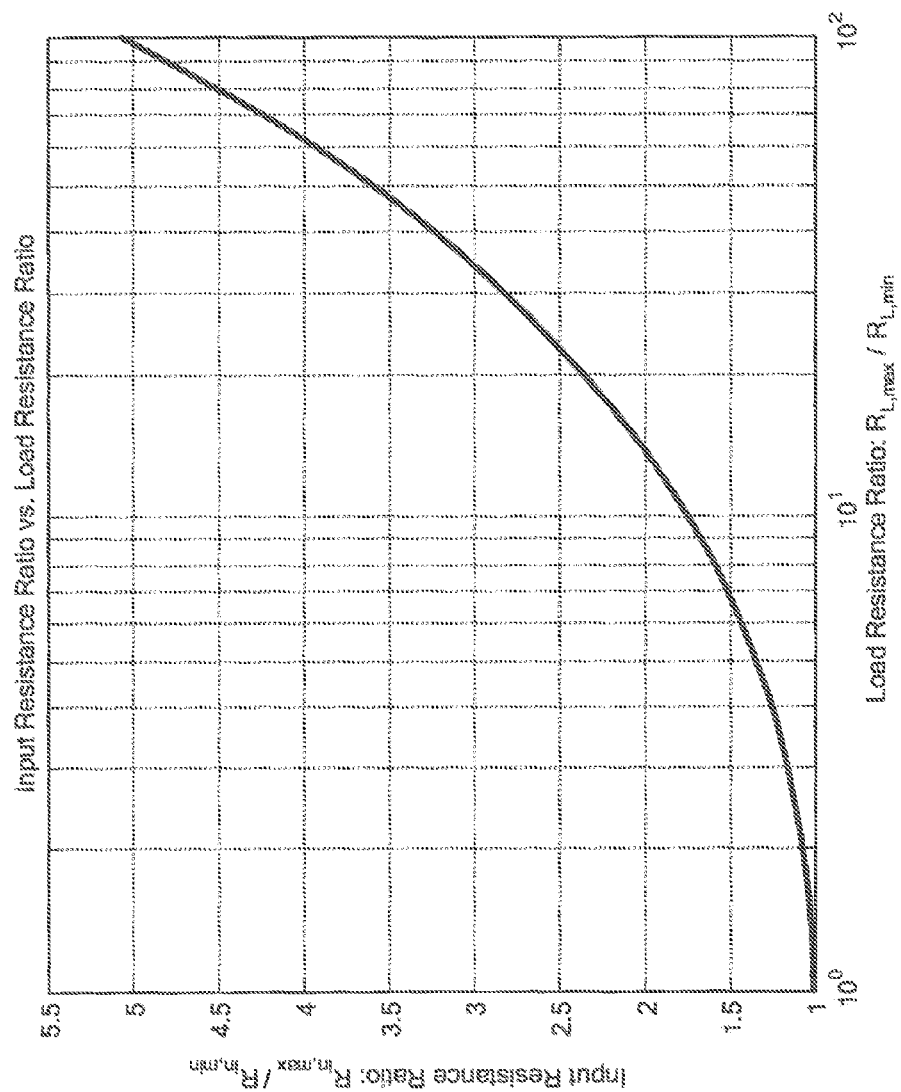
FIG. 10C is a plot showing the ratio of maximum input resistance to minimum input resistance plotted versus the ratio of maximum load resistance to minimum load resistance for a single-level transmission-line resistance compression network, assuming balanced compression.

FIG. 10C shows the detail of the ratio of the maximum to minimum input resistance plotted as a function of the maximum to minimum load resistance, assuming balanced compression (i.e., with $R_{L,center}$ selected as the geometric mean of $R_{L,max}$ and $R_{L,min}$). For this case, we find:

$$\frac{R_{in,max}}{R_{in,min}} = \frac{1}{2}\left[\sqrt{\frac{R_{L,max}}{R_{L,min}}} + \sqrt{\frac{R_{L,min}}{R_{L,max}}}\right] \quad (7)$$

Which, for large values of $R_{L,max}/R_{L,min}$ approaches:

$$\frac{R_{in,max}}{R_{in,min}} \approx \frac{1}{2}\sqrt{\frac{R_{L,max}}{R_{L,min}}} \quad (8)$$

The high degree of resistance compression provided by this system can be seen in these expressions and in FIG. 10C, with a 10:1 ratio of load resistance compressed to a 1.74:1 ratio in input resistance and a 100:1 ratio in load resistance compressed to only a 5.05:1 ratio in input resistance. As with conventional resistance compression networks, one can also use the TLRCN to provide phase compression in which for identical non-resistive loads, the input impedance is more nearly resistive than the load impedances themselves.

It should be noted that other base lengths besides $l_{Base}=\lambda/4$ ($\theta_{Base}=\pi/2$ radians) can be used. For example, a base length of $l_{Base}=\lambda/2$ ($\theta_{Base}=\pi$ radians) likewise results in equal power transfer to the two loads and a compressed resistive input impedance. The characteristics associated with this base length will be the same as that in Equations (3)-(6), except with $\cot(\Delta\theta)$ replaced with $-\tan(\Delta\theta)$ in each expression. Likewise, operation will be the same with any additional multiple of $\lambda/2$ added to the base length. Because of this, with appropriate selections of base length at a desired fundamental frequency, the system can be designed to also provide resistance compression at one or more harmonic frequencies (and at subharmonic frequencies), provided that the loads have appropriate frequency characteristics.

There are multiple possible design approaches for TLRCN circuits. Considering a base length $l_{Base}=\lambda/4$ ($\theta_{Base}=\pi/2$ radians), one may a priori select a value of $\Delta\theta=\pi/4$ radians ($\Delta l=\lambda/8$), such that $\theta_1=3\pi/4$ and $\theta_2=\pi/4$. For balanced compression, one may then select $Z_0$ as $R_{L,center}$ (the geometric mean of the maximum and minimum load resistances $R_{L,max}$ and $R_{L,min}$). In this case, the load resistances loading each transmission-line section vary (geometrically) about the characteristic impedance of the lines, which helps reduce required transmission-line reflection and loss. This design choice provides a compressed input resistance having a range of values determined by the load resistances. In cases where this range of input resistance values is not what is desired for the system, an additional impedance transformation stage may be placed at the input of the TLRCN. One highly effective means to do this is to add an additional quarter-wave line at the input to the compression stage, as illustrated in FIG. 10D.

Figure 10D:
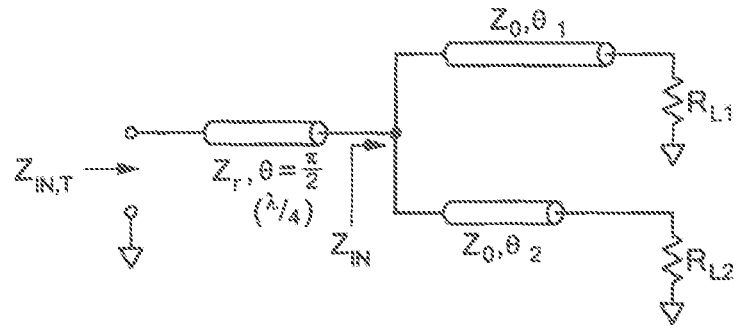
FIG. 10D is a schematic diagram illustrating a transmission-line resistance compression network (TLRCN) providing power dividing and impedance shaping and having an input port and two output ports, with the output ports loaded with a pair of resistive loads.

The whole transmission-line structure of FIG. 10D is likewise itself a resistance compression network having both a compression stage and a transformation stage. The quarter wave line is selected to have a characteristic impedance $Z_T$ that provides an impedance transformation between the resistance obtained at the input of the compression stage (e.g., $Z_{in,median}$, the median of the range of the input resistance $Z_{in}$ or a similar value related to $Z_{in}$) and that desired for the input of the system ($Z_{in,T}$). In this case, to obtain an overall input resistance near a desired value $Z_{in,T,desired}$, we may select:

$$Z_T = \sqrt{Z_{in,T,desired} Z_{in,median}}. \quad (9)$$

Another design approach takes advantage of the freedom to choose both the differential length and the characteristic impedance of the transmission lines. One can also choose the base length. In the example that follows, a base length of $\theta_{Base}=\pi/2$ radians at the operating frequency will be used. By properly selecting the differential length and the characteristic impedance, within certain bounds, one can directly realize both resistance compression and a desired specified input resistance directly with the structure of FIG. 10A. In this design approach, one may start with a center resistance $R_{L,center}$ about which load resistances are compressed. For balanced compression, $R_{L,center}$ is chosen as the geometric mean of the maximum and minimum load resistances, $R_{L,max}$ and $R_{L,min}$. A desired minimum input resistance $R_{in,min}$ of any value below $R_{L,center}$ may then be chosen. The input resistance will take on values at and above $R_{in,min}$, with the range of $R_{in}$ values depending on the range of the $R_L$ values as per Equation (7). One option is to select $R_{in,min}$ to be the desired resistance $R_{in,desired}$ seen at the input of the TLRCN (recognizing that the actual input resistance will be at or above the desired value). Another option is to set the median value of the input resistance that occurs over the range of load resistances to match the desired input resistance. To achieve this for a given maximum to minimum load resistance ratio, one may select $R_{in,min}$ as follows:

$$R_{in,min} = \frac{2 \cdot R_{in,desired}}{1 + \frac{1}{2}\sqrt{\frac{R_{L,max}}{R_{L,min}}} + \frac{1}{2}\sqrt{\frac{R_{L,min}}{R_{L,max}}}} \quad (10)$$

One could likewise select $R_{in,min}$ to be some other value close to $R_{in,desired}$ to achieve good results.

Based on selecting $R_{L,center}$ and $R_{in,min}$ as described above (with resistance $R_{in,min}$ necessarily selected below $R_{L,center}$), one can directly choose $Z_0$ and $\Delta\theta$ of the network of FIG. 10A to provide both the needed compression and impedance transformation, as follows:

$$\cot(\Delta\theta) = \sqrt{\frac{R_{L,center}}{R_{in,min}} - 1} \quad (11)$$

$$Z_0 = \frac{R_{L,center}}{\sqrt{\frac{R_{L,center}}{R_{in,min}} - 1}} \quad (10)$$

This design choice has the advantage of providing both resistance compression and impedance transformation (where needed) in a compact structure. However, the practicality of such an implementation will depend on the desired values. For example, as $R_{in,min}$ approaches $R_{L,center}$, the characteristic impedance of the transmission line can grow unreasonably large. It should also be appreciated that one can use the selection of the transmission-line impedance and differential length to provide a first-degree of impedance transformation, and add another quarter-wave transformer at the input (and/or a set of quarter-wave transformers between the base compression stage and the loads) to provide additional impedance transformation.

Figure 10E:
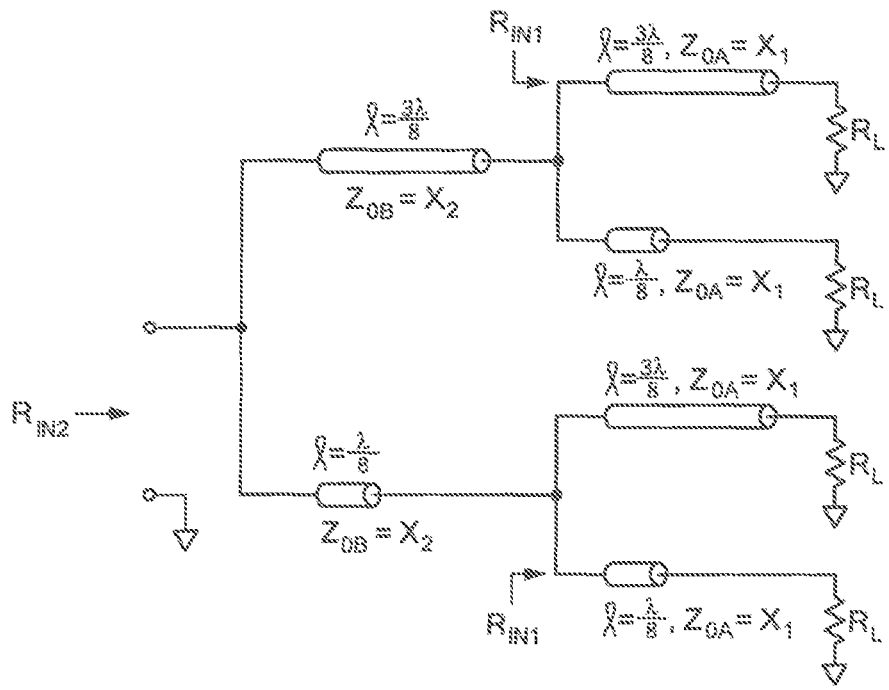
FIG. 10E is a schematic diagram of an exemplary multi-level transmission-line resistance compression network (TLRCN) providing power dividing and impedance shaping and having an input port and four output ports, with the output ports loaded with resistive loads.

As with conventional resistance compression networks, one may construct multi-stage or multi-level compression networks to provide greater degrees of resistance compression than obtained with a single-level design. As with conventional resistance compression networks, this may be done by cascading single-level resistance compression stages in a tree structure, though other structural implementations of multi-level TLRCNs are possible. FIG. 10E shows an exemplary two-stage TLRCN. This example utilizes $l_{Base}=\lambda/4$ ($\theta_{Base}=\pi/2$ radians), and differential lengths $\Delta l=\lambda/8$ ($\Delta\theta=\pi/4$) radians ($\Delta l=\lambda/8$), such that $\theta_1=3\pi/4$ and $\theta_2=\pi/4$ in each stage. With this selection of differential lengths, a multi-stage TLRCN can be optimized (in terms of minimizing the peak deviation from a median input resistance) just as with conventional reactance-based multi-level RCNs (see, e.g., "A New Power Combining and Outphasing Modulation System for High-Efficiency Power Amplification," by Perreault et al., *IEEE Transactions on Circuits and Systems—I*, Vol. 58, No. 8, pp. 1713-1726, August 2011; and U.S. Patent Publication No. 2011/0187437 to Perreault et al., entitled "Radio-Frequency (RF) Amplifier Circuits and Related Techniques," which is hereby incorporated by reference in its entirety), with the transmission-line characteristic impedances of the lines in the two stages taking the place of the reactance amplitudes of the two stages. Alternatively, both the characteristic impedances and the base and differential lengths of each stage can be optimized to provide an overall desired input resistance level and transformation, with the opportunity to achieve additional goals through the parameter selection, such as minimizing RCN loss.

Figure 10F:
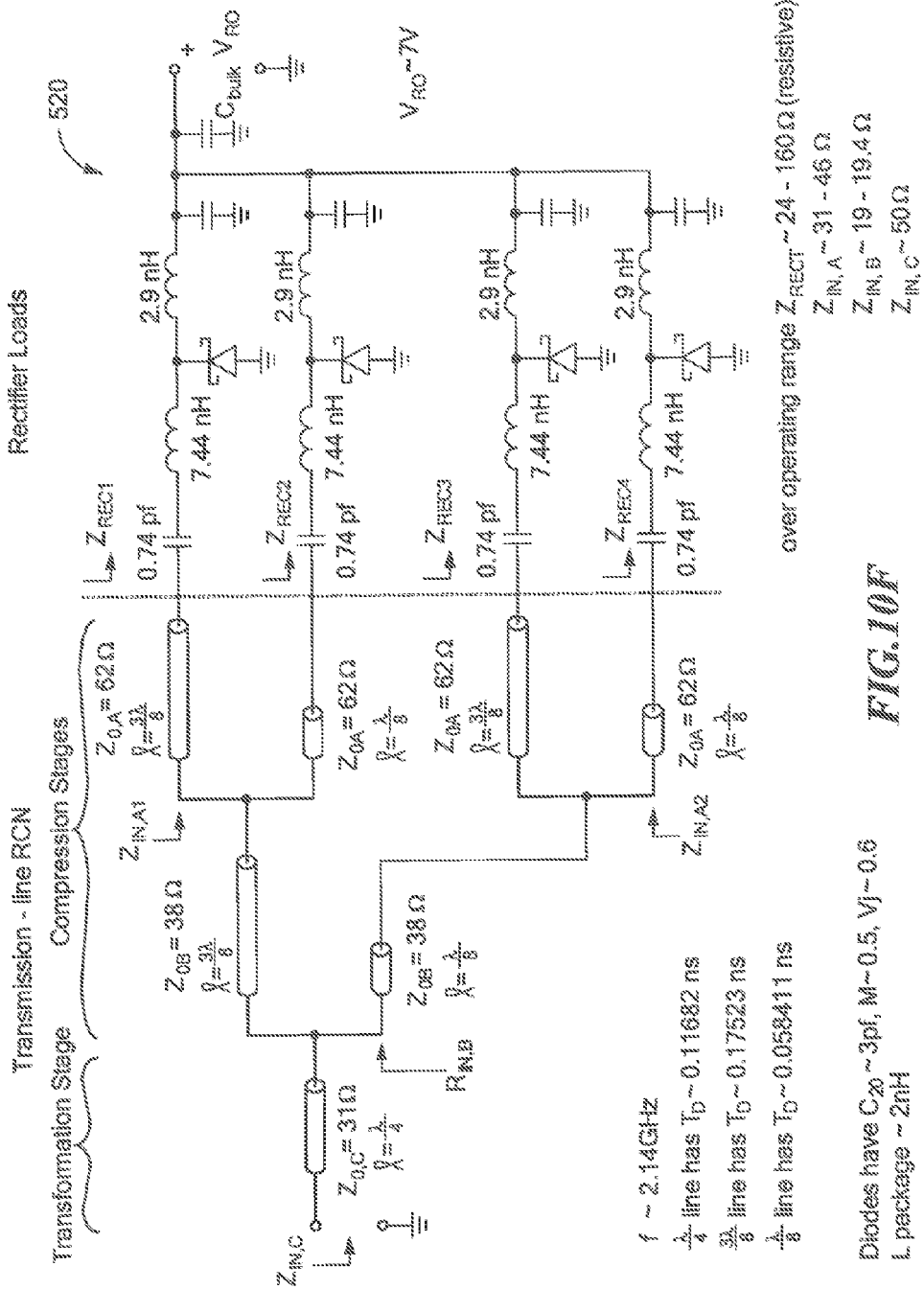
FIG. 10F is a schematic diagram of an exemplary resistance-compressed rectifier system incorporating a multi-level transmission-line resistance compression network (TLRCN) and a set of resonant rectifiers.

Combining a transmission-line resistance compression network with a set of rectifiers forms a resistance compressed rectifier system. An exemplary resistance-compressed rectifier system 520 incorporating a TLRCN is shown in FIG. 10F. This system is for 2.14 GHz operation, and has four tuned rectifiers as loads for the TLRCN that act as approximately resistive loads, each providing ac input impedance of –24-160 t over an input power range of 0.125-1.07 W (and a dc rectifier output power of 0.08-0.85 W) at a rectifier output voltage of 7 V. The rectifier also includes a series-resonant input filter, and is tuned for resistive operation by appropriate resonance between the device capacitance and output inductance. Note that these filtering and tuning elements can be provided as discrete components or constructed in a printed circuit board (optionally including elements such as transmission-line sections, gap capacitors, etc.). The TLRCN has two compression stages and a transformation stage. The first compression-stage "A" compresses the resistances presented by the rectifiers into a range of 31-46Ω (for the first-stage input impedances $Z_{in,A1}$ and $Z_{in,A2}$, which act as the load for the second stage of compression). The second stage further compresses this to an input impedance $Z_{in,B}$ of approximately 9-19.4Ω resistive over the rectifier load resistance range. The transformation stage, comprising a quarter-wave line, transforms this impedance into the overall input impedance of approximately 50Ω.

It will be appreciated that the inventive energy recovery system can be employed in numerous other applications in which energy is conventionally delivered to a resistive termination. By replacing the lossy termination with the energy recovery system, the power that would otherwise be lost can be captured and converted to a useful form, while maintaining a desirable loading characteristic at the termination port.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. An energy recovery system to simulate behavior of a resistive termination for a radio frequency (RF) circuit coupled to the energy recovery system, the energy recovery system comprising:
   a rectification system having a plurality of tuned rectifier circuits and a plurality of rectifier input ports corresponding to the plurality of tuned rectifier circuits, the rectification system to rectify RF energy received at the plurality of rectifier input ports to generate a direct current (dc) signal at one or more rectifier output ports;
   an RF input network having an RF input port and multiple RF output ports, the RF input port forming an input of the energy recovery system and the multiple RF output ports being coupled to the plurality of rectifier input ports of the rectification system, the RF input network to provide input power distribution to the plurality of tuned rectifier circuits and input impedance shaping to shape the combined input impedance of the plurality of tuned rectifier circuits as seen at the RF input port of the RF input network; and
   a dc-dc converter system having an energy recovery input port and a dc output port, the energy recovery input port of the dc-dc converter system coupled to the output port of at least one rectifier to convert rectified power to a useable dc output voltage, wherein the voltage at the energy recovery input port of the dc-dc converter system is regulated.

2. The energy recovery system of claim 1, wherein:
   the rectification system includes a single rectifier output port that carries a combined dc signal of the plurality of tuned rectifier circuits, the single rectifier output port being coupled to the energy recovery input port of the dc-dc converter system.

3. The energy recovery system of claim 2, wherein:
   the dc-dc converter system comprises a dc-dc converter that regulates its input voltage.

4. The energy recovery system of claim 3, wherein:
   the dc-dc converter is configured so that the regulated input voltage of the dc-dc converter changes based, at least in part, on an RF input power level of the rectification system.

5. The energy recovery system of claim 2, further comprising:
   at least one additional RF input network and at least one additional rectification system coupled to the energy recovery input port of the dc-dc converter system.

6. The energy recovery system of claim 2, wherein:
   the dc-dc converter system comprises a three-or-more port dc-dc converter that includes a first port whose voltage is regulated by the dc-dc converter and which receives an output signal of the rectification system, a second port to output recovered energy to a load device, and a third port to provide power to the dc-dc converter for use in regulating the output voltage of the second port.

7. The energy recovery system of claim 6, wherein:
   the third port of the dc-dc output converter is coupled to an energy buffer for use in storing energy to regulate the output voltage of the second port.

8. The energy recovery system of claim 2, wherein:
   the dc-dc converter system comprises a first dc-dc converter having an input port and an output port, the first dc-dc converter input port coupled to the single rectifier output port to convert rectified power to a useable dc output voltage at the first dc-dc converter output port; and a second dc-dc converter having an output port coupled to an input port of the first dc-dc converter to regulate an input voltage thereof.

9. The energy recovery system of claim 8, wherein:
the first and second dc-dc converters are both switched-mode converters.

10. The energy recovery system of claim 8, wherein:
one of the first and second dc-dc converters is a linear regulator and the other of the first and second dc-dc converters is a switched-mode converter.

11. The energy recovery system of claim 1, wherein:
the rectification system includes multiple rectifier output ports that each correspond to a subgroup of the plurality of tuned rectifier circuits; and
the dc-dc converter system comprises multiple dc-dc converters having regulated input voltages coupled to the multiple rectifier output ports to receive dc signals from the multiple rectifier output ports and covert them to one or more useable dc output voltages.

12. The energy recovery system of claim 1, wherein:
the RF input network includes a resistance compression network (RCN) to compress the resistance of the combined input impedance of the plurality of tuned rectifier circuits as seen at the RF input port of the RF input network.

13. The energy recovery system of claim 12, wherein:
the resistance compression network has an order of 2 or greater.

14. The energy recovery system of claim 12, wherein:
the resistance compression network is a lossless or near lossless network.

15. The energy recovery system of claim 14, wherein:
the resistance compression network includes a pair of complementary reactances each having a terminal connected to a common potential.

16. The energy recovery system of claim 12, wherein:
the resistance compression network includes one or more transmission line sections.

17. The energy recovery system of claim 1, wherein:
the plurality of tuned rectifier circuits includes at least one tuned rectifier circuit that is tuned to provide an approximately resistive input impedance.

18. A machine implemented method for use in capturing energy output by a radio frequency (RF) circuit, the method comprising:
receiving an RF signal from the RF circuit;
distributing the RF signal among a plurality of tuned rectifier circuits, the plurality of tuned rectifier circuits to each generate a direct current (dc) signal at an output thereof in response to the RF input signal;
providing impedance shaping in coupling the input of the RF circuit to the input impedances of the plurality of tuned rectifier circuits to provide an approximately constant, resistive input impedance to the RF circuit; and
regulating an output voltage of the plurality of tuned rectifier circuits.

19. The method of claim 18, further comprising:
applying one or more dc signals output by the plurality of tuned rectifier circuits to one or more dc-dc output converters, at least one of which has a regulated input voltage, to convert the one or more dc signals to one or more useable dc output voltages.

20. The method of claim 18, wherein:
providing impedance shaping includes providing resistance compression to compress the input impedances of the plurality of tuned rectifier circuits to provide the approximately constant, resistive input impedance to the RF circuit.

21. The method of claim 18, further comprising:
combining output signals of the plurality of tuned rectifier circuits to generate a combined output signal;
delivering the combined output signal to a dc-dc output converter to convert the combined output signal to a useable dc output voltage; and
regulating an input voltage of the dc-dc output converter.

22. The method of claim 18, wherein:
distributing the RF signal among a plurality of tuned rectifier circuits includes delivering a portion of the RF signal to a first tuned rectifier circuit that is tuned to provide an approximately resistive input impedance.

* * * * *